(12) United States Patent
Ueno et al.

(10) Patent No.: US 12,178,103 B2
(45) Date of Patent: Dec. 24, 2024

(54) DISPLAY DEVICE LUMINANCE DETERMINED BY CONTROLLING A FIRST LIGHT-EMITTING ELEMENT'S LIGHTING PERIOD AND A SECOND LIGHT-EMITTING ELEMENT'S CURRENT VALUE

(71) Applicant: SHARP KABUSHIKI KAISHA, Sakai (JP)

(72) Inventors: Masafumi Ueno, Sakai (JP); Masayuki Takahashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 13 days.

(21) Appl. No.: 18/012,489

(22) PCT Filed: Jun. 25, 2020

(86) PCT No.: PCT/JP2020/024958
§ 371 (c)(1),
(2) Date: Dec. 22, 2022

(87) PCT Pub. No.: WO2021/260873
PCT Pub. Date: Dec. 30, 2021

(65) Prior Publication Data
US 2023/0263025 A1    Aug. 17, 2023

(51) Int. Cl.
*H10K 59/35*     (2023.01)
*G09G 3/20*      (2006.01)
*G09G 3/3233*    (2016.01)

(52) U.S. Cl.
CPC ........... *H10K 59/35* (2023.02); *G09G 3/2018* (2013.01); *G09G 3/3233* (2013.01); *G09G 2300/0452* (2013.01); *G09G 2300/0842* (2013.01); *G09G 2300/0861* (2013.01); *G09G 2320/0261* (2013.01); *G09G 2320/064* (2013.01); *G09G 2320/106* (2013.01)

(58) Field of Classification Search
USPC .......................................................... 345/691
See application file for complete search history.

(56) References Cited

U.S. PATENT DOCUMENTS

| | | | | |
|---|---|---|---|---|
| 2002/0190935 A1* | 12/2002 | Maeda | ................. | G09G 3/3225 345/76 |
| 2006/0231842 A1* | 10/2006 | Hirakata | .............. | H10K 59/351 257/72 |
| 2019/0108790 A1* | 4/2019 | Liang | .................... | G09G 3/3241 |
| 2019/0189045 A1* | 6/2019 | Hwang | ................ | G09G 3/2003 |
| 2019/0258113 A1* | 8/2019 | Tsuchida | ............... | G09G 3/3426 |
| 2021/0110763 A1* | 4/2021 | Morita | ................. | G09G 3/2085 |

FOREIGN PATENT DOCUMENTS

| | | | | |
|---|---|---|---|---|
| CN | 111312175 A | * | 6/2020 | ........... G09G 3/3258 |
| JP | 2005227543 A | * | 8/2005 | |
| JP | 2006344913 A | | 12/2006 | |
| JP | 2007025317 A | | 2/2007 | |
| JP | 2008209833 A | | 9/2008 | |

* cited by examiner

*Primary Examiner* — Kirk W Hermann
(74) *Attorney, Agent, or Firm* — ScienBiziP, P.C.

(57) ABSTRACT

A display device includes a pixel including light-emitting elements in which light emission luminance during a predetermined period is controlled by controlling a lighting period among the predetermined period, and light-emitting elements in which light emission luminance is controlled by controlling a current value.

19 Claims, 22 Drawing Sheets

DISPLAY DEVICE LUMINANCE DETERMINED BY CONTROLLING A FIRST LIGHT-EMITTING ELEMENT'S LIGHTING PERIOD AND A SECOND LIGHT-EMITTING ELEMENT'S CURRENT VALUE

TECHNICAL FIELD

The disclosure relates to a display device including a light-emitting element.

BACKGROUND ART

In recent years, various display devices have been developed. In particular, a display device provided with a light-emitting element such as a quantum dot light emitting diode (QLED), an organic light-emitting diode (OLED), and a micro light-emitting diode (Micro LED) has attracted a great deal of attention from perspectives such as the ability to achieve lower power consumption, a slimmer design, and higher picture quality.

PTLs 1 and 2 disclose control of the light-emitting element provided in the display device.

CITATION LIST

Patent Literature

PTL 1: JP 2008-209833A (published on Sep. 11, 2008)
PTL 2: JP 2007-25317 A (published on Feb. 1, 2007)

SUMMARY

Technical Problem

PTL 1 discloses that a display region of a display device is divided into a segment region and a dot matrix region, the segment region is statically driven for display, and the dot matrix region is passive-matrix driven for display. Each light-emitting element in the segment region is driven by the static drive, and thus light emission luminance is controlled by changing a pulse width of a pulse width modulation signal (PWM signal) that is a signal for adjusting a lighting period in one frame period. Each light-emitting element in the dot matrix region is driven by the passive matrix drive, and thus the light emission luminance is controlled by changing a height of a pulse having a length of 1/N period obtained by dividing the one frame period by a number N of scanning signal lines, that is, by changing a current value.

In the case of the display device disclosed in PTL 1, in the segment region, the light emission luminance is controlled only by PWM drive, and in the dot matrix region, the light emission luminance is controlled only by changing the current value, and thus there is a problem in that grayscale reproducibility cannot be obtained to a satisfactory degree in each pixel of each region.

PTL 2 discloses that, the light emission period of each pixel is made longer as an average luminance level in units of surfaces is smaller, and the light emission period of each pixel is made shorter as the average luminance level in units of surfaces is larger, thereby suppressing the maximum power consumption within a certain range. However, in the case of the display device disclosed in PTL 2, since each self-light-emitting element changes the current value and the grayscale thereof, that is, the light emission luminance is controlled, there is a problem in that the grayscale reproducibility cannot be obtained to a satisfactory degree in each pixel.

The disclosure has been made in view of the above problems, and an object of the disclosure is to provide a display device with improved grayscale reproducibility in each pixel.

Solution to Problem

In order to solve the problem described above, a display device according to the disclosure includes a pixel including a first light-emitting element in which light emission luminance during a predetermined period is controlled by controlling a lighting period among the predetermined period, and a second light-emitting element in which light emission luminance is controlled by controlling a current value.

Advantageous Effects of Disclosure

According to an aspect of the disclosure, it is possible to provide a display device with improved grayscale reproducibility in each pixel.

Each of FIGS. 6(a), (b), (c), (d), (e), and (f) is a cross-sectional view illustrating a schematic configuration of one pixel of a display device being a modified example according to the first embodiment.

FIG. 7(a) is a plan view illustrating one pixel of a display device according to a second embodiment, and (b) is a cross-sectional view illustrating a schematic configuration of one subpixel included in one pixel of the display device according to the second embodiment.

Each of FIGS. 8(a), (b), (c), (d), (e), (f), and (g) is a plan view illustrating one pixel of a display device being a modified example according to the second embodiment.

Each of FIGS. 9(a), (b), (c), (d), (e), (f), and (g) is a plan view illustrating one pixel of a display device being further another modified example according to the second embodiment.

Figure 10:
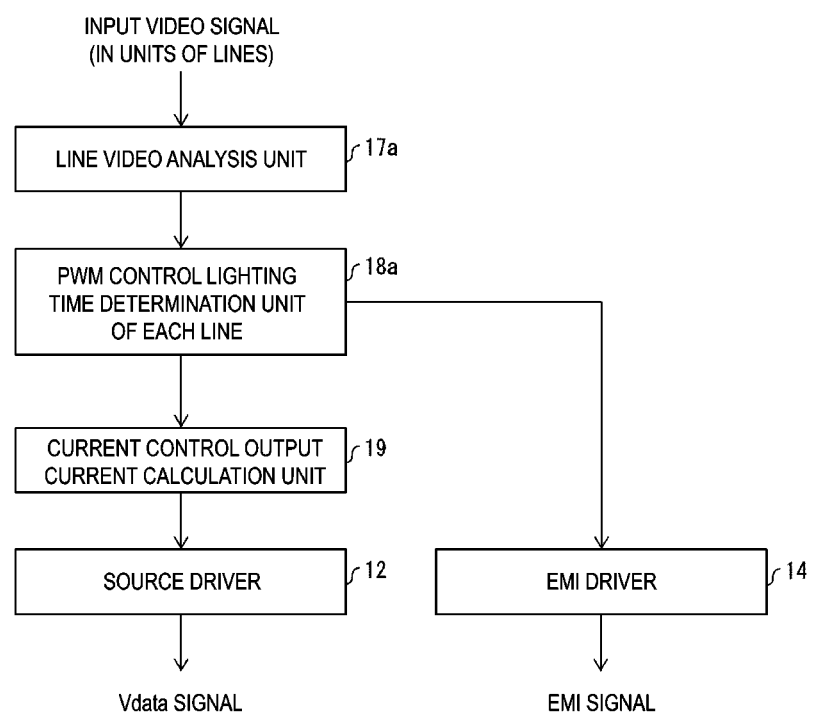

FIG. 10 is a diagram illustrating a schematic configuration of an input video signal processor provided in a display device according to a third embodiment.

FIGS. 11(a) and (b) are diagrams for describing signal processing performed in the input video signal processor provided in the display device according to the third embodiment.

FIGS. 12(a), (b), (c), and (d) are diagrams for describing signal processing performed in the input video signal processor provided in the display device according to the third embodiment.

Figure 13:
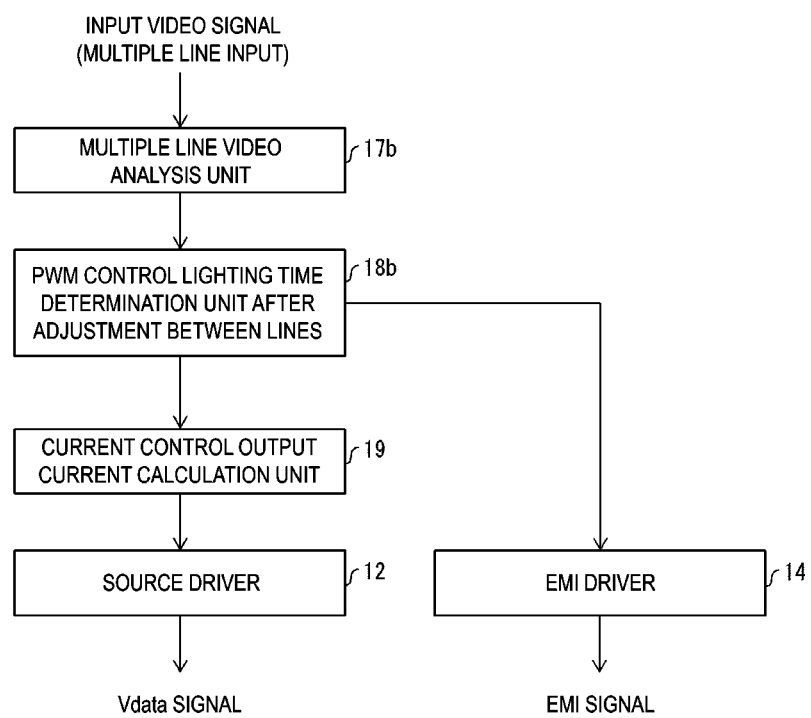

FIG. 13 is a diagram illustrating a schematic configuration of an input video signal processor provided in a display device according to a fourth embodiment.

Figure 14:
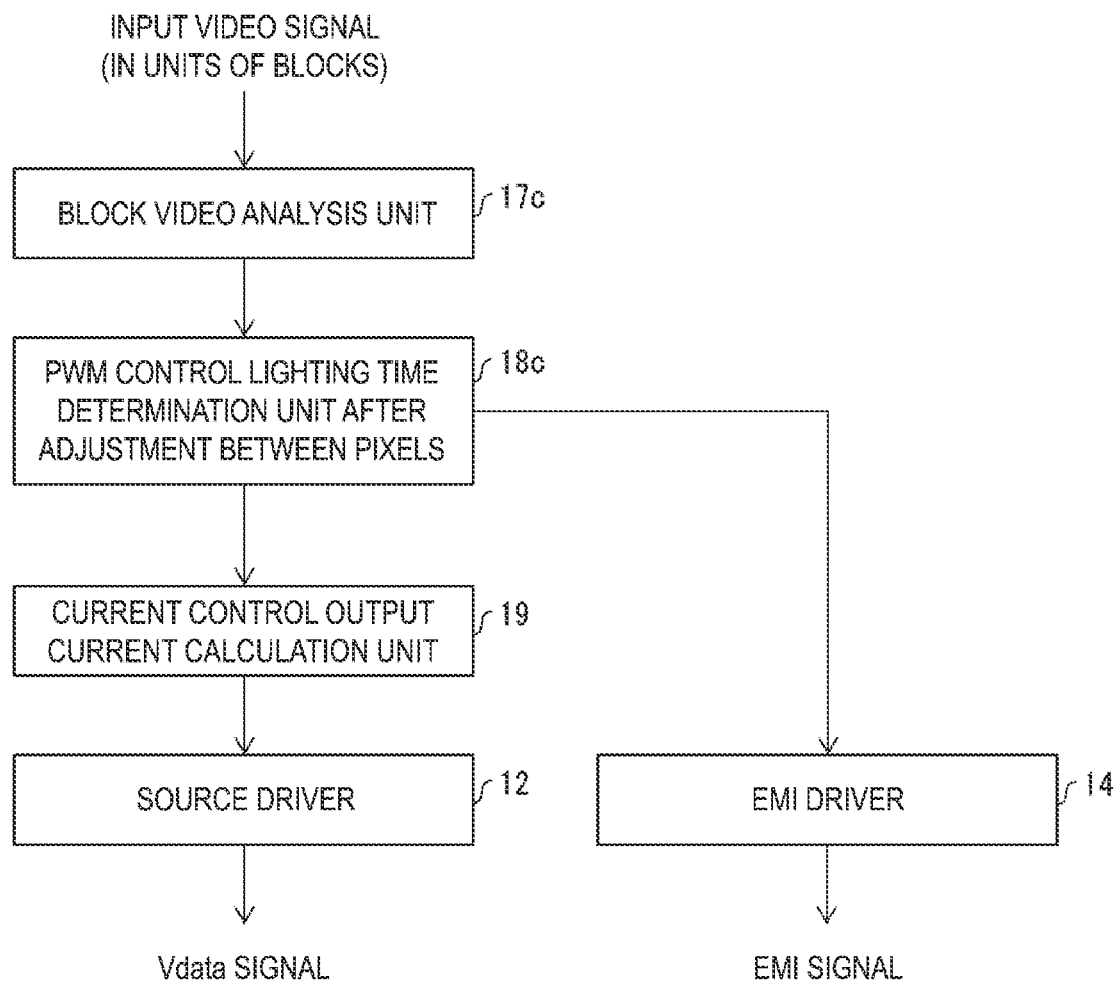

FIG. 14 is a diagram illustrating a schematic configuration of an input video signal processor provided in a display device according to a fifth embodiment.

Figure 15:
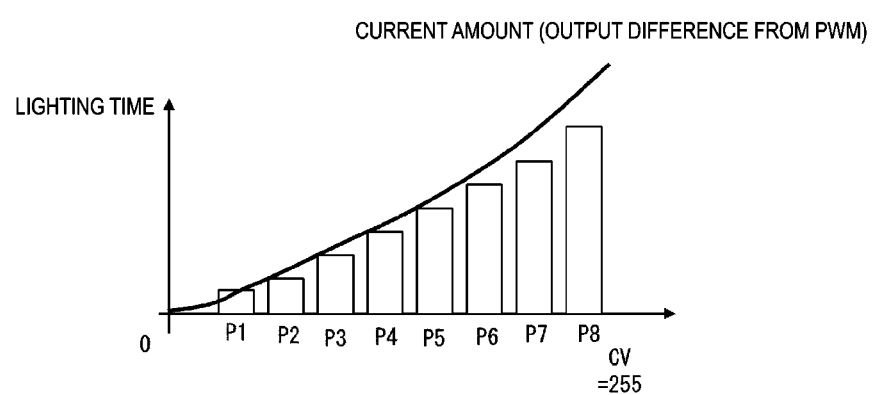

FIG. 15 is a diagram for describing signal processing performed in the input video signal processor provided in the display device according to the fifth embodiment.

FIG. 16(a) is a diagram showing element characteristic of a light-emitting element included in each pixel of a display device according to a sixth embodiment and driven by changing a pulse width of a pulse width modulation signal, and (b) is a diagram showing element characteristic of a light-emitting element included in each pixel of the display device according to the sixth embodiment and driven by changing a current value.

Figure 17:
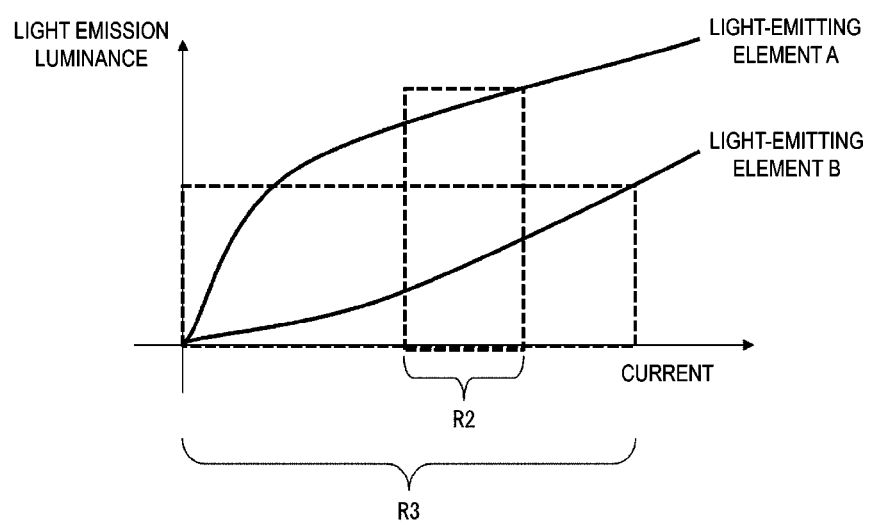

FIG. 17 is a diagram for describing driving methods of the light-emitting element driven by changing a pulse width of a pulse width modulation signal and the light-emitting element driven by changing a current value, which are included in each pixel of the display device according to the sixth embodiment.

FIGS. 18(a) and (b) are views illustrating display regions provided in a display device according to a seventh embodiment.

Figure 19:
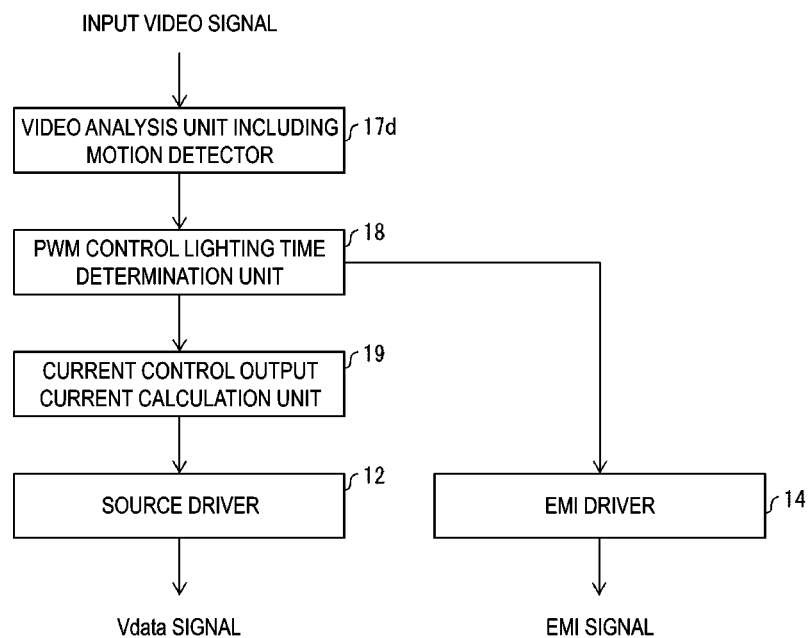

FIG. 19 is a diagram illustrating a schematic configuration of an input video signal processor provided in a display device according to an eighth embodiment.

Figure 20:
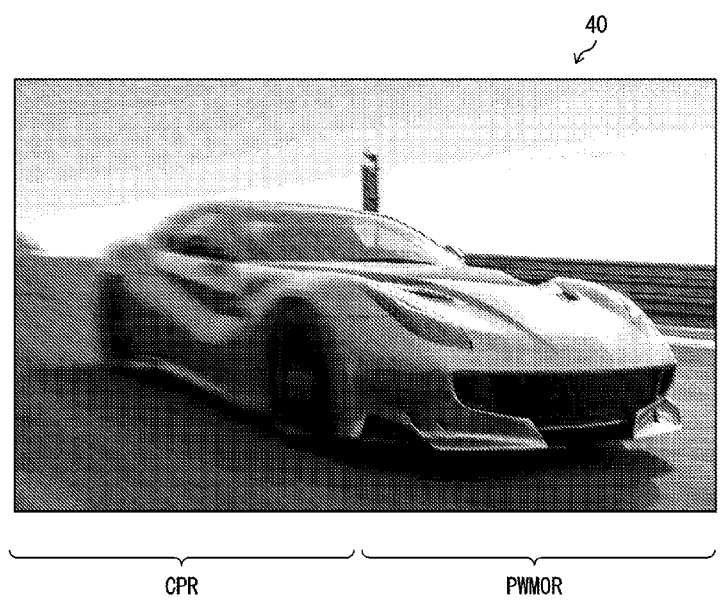

FIG. 20 is a view illustrating a display region provided in the display device according to the eighth embodiment.

Figure 21:
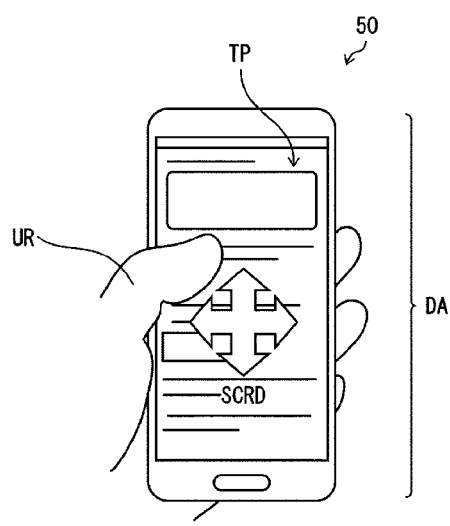

FIG. 21 is a view illustrating a display region provided in a display device according to a ninth embodiment.

Figure 22:
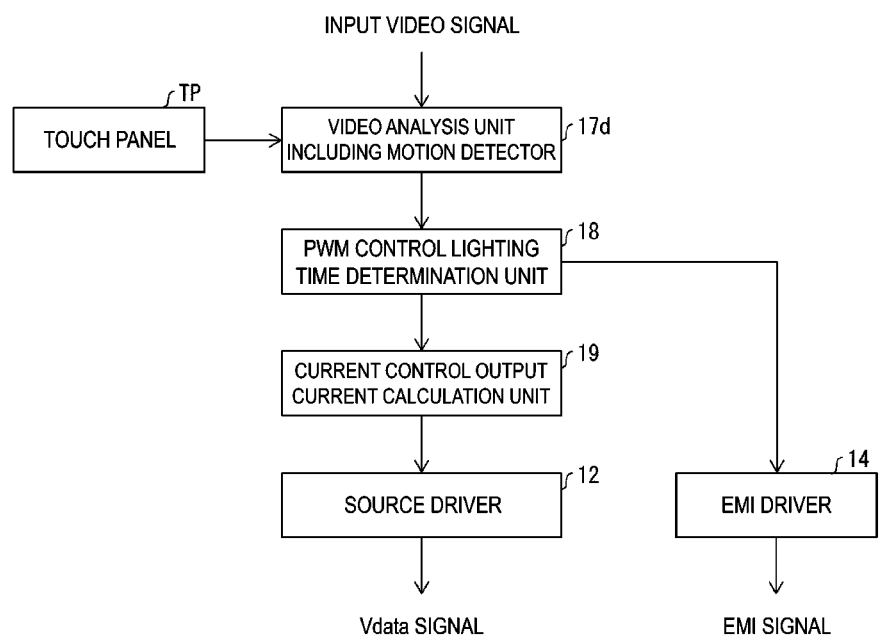

FIG. 22 is a diagram illustrating a schematic configuration of an input video signal processor provided in the display device according to the ninth embodiment.

DESCRIPTION OF EMBODIMENTS

A description follows regarding embodiments of the disclosure, with reference to FIG. 1 to FIG. 22. Hereinafter, for convenience of explanation, components having the same functions as those described in a specific embodiment are appended with the same reference signs, and descriptions thereof may be omitted.

Figure 1:
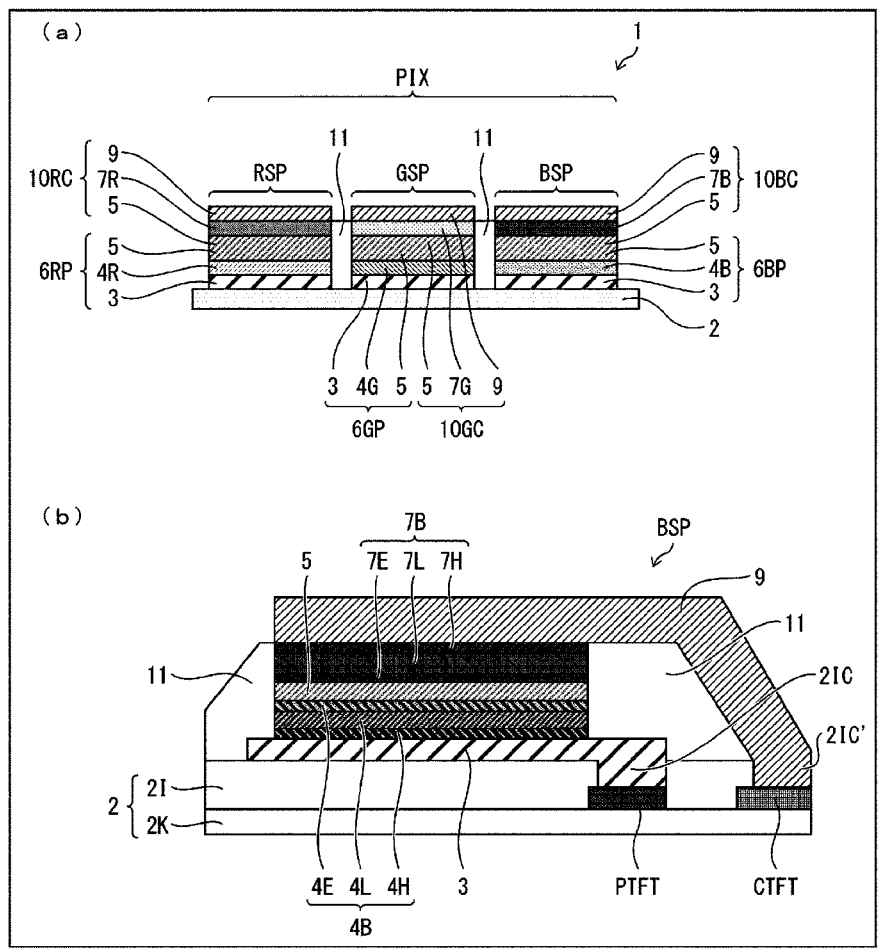
FIG. 1(a) is a view illustrating a schematic configuration of a display device according to a first embodiment, and (b) is an enlarged partial view of one subpixel included in one pixel of the display device according to the first embodiment.

First Embodiment (a) of FIG. 1 is a view illustrating a schematic configuration of a display device 1 according to a first embodiment, and (b) of FIG. 1 is an enlarged partial view of a blue subpixel BSP included in one pixel PIX of the display device 1 according to the first embodiment.

As illustrated in (a) of FIG. 1, one pixel PIX of the display device 1 includes a red subpixel RSP, a green subpixel GSP, and the blue subpixel BSP. Note that, although not illustrated, the display device 1 includes a display region including a plurality of the pixels PIX. In the display device 1 of the present embodiment, a case will be described as an example in which the one pixel PIX includes the red subpixel RSP, the green subpixel GSP, and the blue subpixel BSP, but the present embodiment is not limited thereto, and the one pixel PIX may further include a subpixel of another color.

As illustrated in (a) of FIG. 1, the display device 1 includes an active substrate 2 including a thin film transistor layer (TFT layer) including a plurality of thin film transistors, a PWM drive red light-emitting element 6RP, a PWM drive green light-emitting element 6GP, and a PWM drive blue light-emitting element 6BP provided on the active substrate 2, a current drive red light-emitting element 10RC provided on the PWM drive red light-emitting element 6RP, a current drive green light-emitting element 10GC provided on the PWM drive green light-emitting element 6GP, and a current drive blue light-emitting element 10BC provided on the PWM drive blue light-emitting element 6BP.

A portion in which the PWM drive red light-emitting element 6RP and the current drive red light-emitting element 10RC are layered is a red subpixel RSP, a portion in which the PWM drive green light-emitting element 6GP and the current drive green light-emitting element 10GC are layered is a green subpixel GSP, and a portion in which the PWM drive blue light-emitting element 6BP and the current drive blue light-emitting element 10BC are layered is a blue subpixel BSP.

In the display device 1 according to the present embodiment, a case will be described as an example in which the current drive red light-emitting element 10RC, the current drive green light-emitting element 10GC, and the current drive blue light-emitting element 10BC are disposed farther from the active substrate 2 than the PWM drive red light-emitting element 6RP, the PWM drive green light-emitting element 6GP, and the PWM drive blue light-emitting element 6BP, however, the present embodiment is not limited thereto. For example, in the display device 1, the PWM drive red light-emitting element 6RP, the PWM drive green light-emitting element 6GP, and the PWM drive blue light-emitting element 6BP may be disposed farther from the active substrate 2 than the current drive red light-emitting element 10RC, the current drive green light-emitting element 10GC, and the current drive blue light-emitting element 10BC.

The PWM drive red light-emitting element 6RP includes an anode electrode 3, a function layer 4R including a red light-emitting layer, and a cathode electrode 5 in this order from the active substrate 2 side. The current drive red light-emitting element 10RC layered on the PWM drive red light-emitting element 6RP includes a cathode electrode 5, which is a common layer with the cathode electrode 5 of the PWM drive red light-emitting element 6RP, a function layer 7R including the red light-emitting layer, and an anode electrode 9 in this order from the active substrate 2 side.

In the present embodiment, the display device 1 is a top-emitting display device, and thus for example, an electrode formed by layering Indium Tin Oxide (ITO) and silver (Ag) and reflecting visible light can be used as the anode electrode 3. For example, an electrode formed of a metal thin film such as a magnesium-silver alloy and transmitting visible light can be used as the cathode electrode 5. For example, an electrode formed of Indium Tin Oxide (ITO) that is a material transmitting visible light can be used as the anode electrode 9.

A layer including, for example, a hole transport layer, a red light-emitting layer, and an electron transport layer in this order from the anode electrode 3 side can be used as the function layer 4R provided between the anode electrode 3 and the cathode electrode 5 of the PWM drive red light-emitting element 6RP and including the red light-emitting layer. The function layer 4R including the red light-emitting layer may further include a hole injection layer between the anode electrode 3 and the hole transport layer or may further include an electron injection layer between the cathode electrode 5 and the electron transport layer, as necessary.

A layer including, for example, an electron transport layer, a red light-emitting layer, and a hole transport layer in this order from the cathode electrode 5 side can be used as the function layer 7R provided between the cathode electrode 5 and anode electrode 9 of the current drive red light-emitting element 10RC and including the red light-emitting layer. The function layer 7R including the red light-emitting layer may further include an electron injection layer between the cathode electrode 5 and the electron transport layer or may further include a hole injection layer between the anode electrode 9 and the hole transport layer, as necessary.

A layer including, for example, a hole transport layer, a green light-emitting layer, and an electron transport layer in this order from the anode electrode 3 side can be used as a function layer 4G provided between the anode electrode 3 and the cathode electrode 5 of the PWM drive green light-emitting element 6GP and including the green light-emitting layer. The function layer 4G including the green light-emitting layer may further include a hole injection layer between the anode electrode 3 and the hole transport layer or may further include an electron injection layer between the cathode electrode 5 and the electron transport layer, as necessary.

A layer including, for example, an electron transport layer, a green light-emitting layer, and a hole transport layer in this order from the cathode electrode 5 side can be used as a function layer 7G provided between the cathode electrode 5 and anode electrode 9 of the current drive green light-emitting element 10GC and including the green light-emitting layer. The function layer 7G including the green light-emitting layer may further include an electron injection layer between the cathode electrode 5 and the electron transport layer or may further include a hole injection layer between the anode electrode 9 and the hole transport layer, as necessary.

A layer including, for example, a hole transport layer, a blue light-emitting layer, and an electron transport layer in this order from the anode electrode 3 side can be used as a function layer 4B provided between the anode electrode 3 and the cathode electrode 5 of the PWM drive blue light-emitting element 6BP and including the blue light-emitting layer. The function layer 4B including the blue light-emitting layer may further include a hole injection layer between the anode electrode 3 and the hole transport layer or may further include an electron injection layer between the cathode electrode 5 and the electron transport layer, as necessary.

A layer including, for example, an electron transport layer, a blue light-emitting layer, and a hole transport layer in this order from the cathode electrode 5 side can be used as a function layer 7B provided between the cathode electrode 5 and anode electrode 9 of the current drive blue light-emitting element 10BC and including the blue light-emitting layer. The function layer 7B including the blue light-emitting layer may further include an electron injection layer between the cathode electrode 5 and the electron transport layer or may further include a hole injection layer between the anode electrode 9 and the hole transport layer, as necessary.

In the present embodiment, a case will be described as an example in which each of the PWM drive red light-emitting element 6RP, the PWM drive green light-emitting element 6GP, the PWM drive blue light-emitting element 6BP, the current drive red light-emitting element 10RC, the current drive green light-emitting element 10GC, and the current drive blue light-emitting element 10BC is a quantum dot light emitting diode (QLED) including quantum dots as a light-emitting layer, however the present embodiment is not limited thereto. For example, each of the PWM drive red light-emitting element 6RP, the PWM drive green light-emitting element 6GP, the PWM drive blue light-emitting element 6BP, the current drive red light-emitting element 10RC, the current drive green light-emitting element 10GC, and the current drive blue light-emitting element 10BC may be an organic light emitting diode (OLED) or a micro light emitting diode (Micro LED). Furthermore, for example, the PWM drive red light-emitting element 6RP, the PWM drive green light-emitting element 6GP, the PWM drive blue light-emitting element 6BP, the current drive red light-emitting element 10RC, the current drive green light-emitting element 10GC, and the current drive blue light-emitting element 10BC may be configured by the QLED and the OLED, may be configured by the QLED and the Micro LED, may be configured by the OLED and the Micro LED, or may be configured by the QLED, the OLED, and the Micro LED.

In the display device 1 according to the present embodiment, a case will be described as an example in which the cathode electrode 5 is formed as a common cathode in each of the PWM drive light-emitting elements 6RP, 6GP, and 6BP and the current drive light-emitting elements 10RC, 10GC, and 10BC, but the present embodiment is not limited thereto. A cathode electrode of the PWM drive light-emitting elements 6RP, 6GP, and 6BP and a cathode electrode of the current drive light-emitting elements 10RC, 10GC, and 10BC may be separately formed.

Note that in the present embodiment, each of the PWM drive red light-emitting element 6RP, the PWM drive green light-emitting element 6GP, the PWM drive blue light-emitting element 6BP, the current drive red light-emitting element 10RC, the current drive green light-emitting element 10GC, and the current drive blue light-emitting element 10BC is a QLED in which the light-emitting layer includes quantum dots. Thus, the light-emitting layer provided in each of the function layers 4R and 7R including the red light-emitting layer, the function layers 4G and 7G including the green light-emitting layer, and the function layers 4B and 7B including the blue light-emitting layer includes the quantum dots. Each quantum dot includes, for example, a core and a shell. For example, any of CdSe, CdSe/CdS, CdSe/ZnS, InP/ZnS, and CIGS/ZnS may be used as the core. For example, an inorganic material or an organic and inorganic mixed material may be used as the shell. A particle size of the quantum dot may be, for example, approximately from 3 nm to 10 nm. Note that, in order to make the light-emitting layers provided in the function layers 4R and 7R including the red light-emitting layer, the function layers 4G and 7G including the green light-emitting layer, and the function layers 4B and 7B including the blue light-emitting layer have center wavelengths of emitted light different from each other, the light-emitting layers may have different particle sizes of quantum dots, or quantum dots of types different from each other may be used. In the present embodiment, a case will be described as an example in which the red light-emitting layer included in the function layer 4R and the red light-emitting layer included in the function layer 7R are formed of the same material, the green light-emitting layer included in the function layer 4G and the green light-emitting layer included in the function layer 7G are formed of the same material, and the blue light-emitting layer included in the function layer 4B and the blue light-emitting layer included in the function layer 7B are formed of the same material, but the present embodiment is not limited thereto.

As illustrated in (b) of FIG. 1, the active substrate 2 includes a substrate 2K and a thin film transistor layer (TFT layer) 21 provided on the substrate 2K.

In the present embodiment, for example, a polyimide resin, an epoxy resin, a polyamide resin, and the like are used as the substrate 2K in order to make the display device 1 a flexible display device, but the present embodiment is not limited thereto. For example, in a case where the display device 1 is a non-flexible display device, for example, a glass substrate may be used as the substrate 2K.

Each of a PWM transistor PTFT and a current drive transistor CTFT included in the thin film transistor layer 21 illustrated in (b) of FIG. 1 includes, for example, a semiconductor film, a gate insulating film, a gate electrode, a first inorganic insulating film, a second inorganic insulating film, a source electrode, and a drain electrode (which are not illustrated) in this order from the substrate 2K side.

The semiconductor film may be formed of low-temperature polysilicon (LTPS) or an oxide semiconductor, for example.

The gate electrode, the source electrode, and the drain electrode may be formed of a single-layer film or a layered film of a metal including at least one of aluminum (Al), tungsten (W), molybdenum (Mo), tantalum (Ta), chromium (Cr), titanium (Ti), copper (Cu), and silver (Ag), for example.

The gate insulating film, the first inorganic insulating film, and the second inorganic insulating film may be formed of, for example, a silicon oxide (SiOx) film, a silicon nitride (SiNx) film, a silicon oxynitride film, or a layered film of these, which are formed by CVD.

The thin film transistor layer 21 includes the PWM transistor PTFT and the current drive transistor CTFT described above, and an interlayer insulating film provided on the PWM transistor PTFT and the current drive transistor CTFT.

The interlayer insulating film may be formed of, for example, a coatable photosensitive organic material such as a polyimide resin or an acrylic resin. The anode electrode 3 of the PWM drive blue light-emitting element 6BP is electrically connected to a drain electrode of the PWM transistor PTFT via a contact hole 21C provided in the interlayer insulating film as illustrated in (b) of FIG. 1. The anode electrode 9 of the current drive blue light-emitting element 10BC is electrically connected to a drain electrode of the current drive transistor CTFT via a contact hole 21C' provided in the interlayer insulating film.

Note that (b) of FIG. 1 is an enlarged partial view of the blue subpixel BSP of the display device 1, and thus only a case is illustrated in which the anode electrode 3 of the PWM drive blue light-emitting element 6BP and the drain electrode of the PWM transistor PTFT are electrically connected to each other, and the anode electrode 9 of the current drive blue light-emitting element 10BC and the drain electrode of the current drive transistor CTFT are electrically connected to each other. The anode electrode 3 of the PWM drive red light-emitting element 6RP and a drain electrode of another PWM transistor PTFT (not illustrated), the anode electrode 9 of the current drive red light-emitting element 10RC and a drain electrode of another current drive transistor CTFT (not illustrated), the anode electrode 3 of the PWM drive green light-emitting element 6GP and a drain electrode of still another PWM transistor PTFT (not illustrated), and the anode electrode 9 of the current drive green light-emitting element 10GC and a drain electrode of still another current drive transistor CTFT (not illustrated) are also electrically connected to each other in the similar manner.

As illustrated in (b) of FIG. 1, in the display device 1, an edge cover (bank) 11 is formed to cover an edge of the anode electrode 3 provided in an island shape on the interlayer insulating film. The edge cover 11 can be formed of, for example, a coatable photosensitive organic material such as a polyimide resin or an acrylic resin.

As illustrated in (b) of FIG. 1, in the blue subpixel BSP of the display device 1 according to the present embodiment, the function layer 4B that is including a blue light-emitting layer 4L and that is provided between the anode electrode 3 and the cathode electrode 5 includes a hole transport layer 4H, the blue light-emitting layer 4L, and an electron transport layer 4E in this order from the anode electrode 3 side. The function layer 7B that is including a blue light-emitting layer 7L and that is provided between the cathode electrode 5 and the anode electrode 9 includes an electron transport layer 7E, the blue light-emitting layer 7L, and a hole transport layer 7H in this order from the cathode electrode 5 side.

Although not illustrated, also in the red subpixel RSP of the display device 1 according to the present embodiment, similarly to the blue subpixel BSP described above, the function layer 4R that is including the red light-emitting layer and that is provided between the anode electrode 3 and the cathode electrode 5 includes the hole transport layer, the red light-emitting layer, and the electron transport layer in this order from the anode electrode 3 side. The function layer 7R that is including the red light-emitting layer and that is provided between the cathode electrode 5 and the anode electrode 9 includes the electron transport layer, the red light-emitting layer, and the hole transport layer in this order from the cathode electrode 5 side.

Although not illustrated, also in the green subpixel GSP of the display device 1 according to the present embodiment, similarly to the blue subpixel BSP described above, the function layer 4G that is including the green light-emitting layer and that is provided between the anode electrode 3 and the cathode electrode 5 includes the hole transport layer, the green light-emitting layer, and the electron transport layer in this order from the anode electrode 3 side. The function layer 7G that is including the green light-emitting layer and that is provided between the cathode electrode 5 and the anode electrode 9 includes the electron transport layer, the green light-emitting layer, and the hole transport layer in this order from the cathode electrode 5 side.

Note that each of the light-emitting elements described above may have a structure in which the cathode electrode and the anode electrode are reversed. In this case, each of the light-emitting elements may have a structure in which the order of the hole transport layer, the light-emitting layer, and the electron transport layer in each of the function layers is reversed. In (b) of FIG. 1, a wiring line to the cathode electrode 5 is not illustrated.

Figure 2:
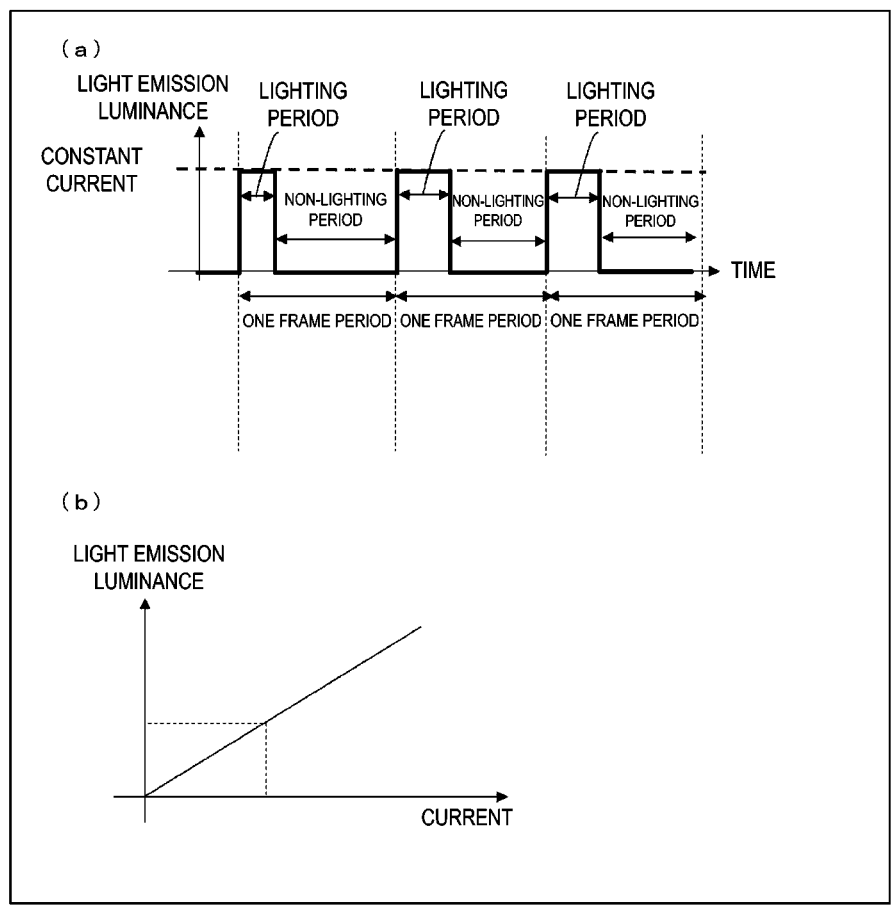
FIG. 2(a) is a diagram for describing how light emission luminance of a light-emitting element included in each pixel of the display device according to the first embodiment and driven by changing a pulse width of a pulse width modulation signal is determined, and (b) is a diagram for describing how light emission luminance of a light-emitting element included in each pixel of the display device according to the first embodiment and driven by changing a current value is determined.

(a) of FIG. 2 is a diagram for describing how light emission luminance of the PWM drive red light-emitting element 6RP, the PWM drive green light-emitting element 6GP, and the PWM drive blue light-emitting element 6BP included in each pixel PIX of the display device 1 is determined. (b) of FIG. 2 is a diagram for describing how light emission luminance of the current drive red light-emitting element 10RC, the current drive green light-emitting element 10GC, and the current drive blue light-emitting element 10BC included in each pixel PIX of the display device 1 is determined.

As shown in (a) of FIG. 2, in each of the PWM drive red light-emitting element 6RP, the PWM drive green light-emitting element 6GP, and the PWM drive blue light-emitting element 6BP, the light emission luminance during a predetermined period (for example, one frame period or a ½ frame period) is controlled by controlling a lighting period among the predetermined period (for example, one frame period or a ½ frame period). In other words, in each of the PWM drive red light-emitting element 6RP, the PWM drive green light-emitting element 6GP, and the PWM drive blue light-emitting element 6BP, the light emission luminance during the predetermined period is controlled by controlling a duty ratio being a ratio of the lighting period among the predetermined period, the predetermined period being obtained by adding the lighting period and the non-lighting period. Note that each of the PWM drive red light-emitting element 6RP, the PWM drive green light-emitting element 6GP, and the PWM drive blue light-emitting element 6BP is driven at a constant current (constant current value) during the lighting period, and is driven at the current value of zero during the non-lighting period.

As shown in (b) of FIG. 2, in each of the current drive red light-emitting element 10RC, the current drive green light-emitting element 10GC, and the current drive blue light-emitting element 10BC, the light emission luminance is controlled by controlling a current value corresponding to the light emission luminance. That is, each of the current drive red light-emitting element 10RC, the current drive green light-emitting element 10GC, and the current drive blue light-emitting element 10BC, is driven at a predetermined current value corresponding to a predetermined light emission luminance during the predetermined period (for example, one frame period), and thus the light emission luminance during the predetermined period is controlled to the predetermined light emission luminance.

Figure 3:
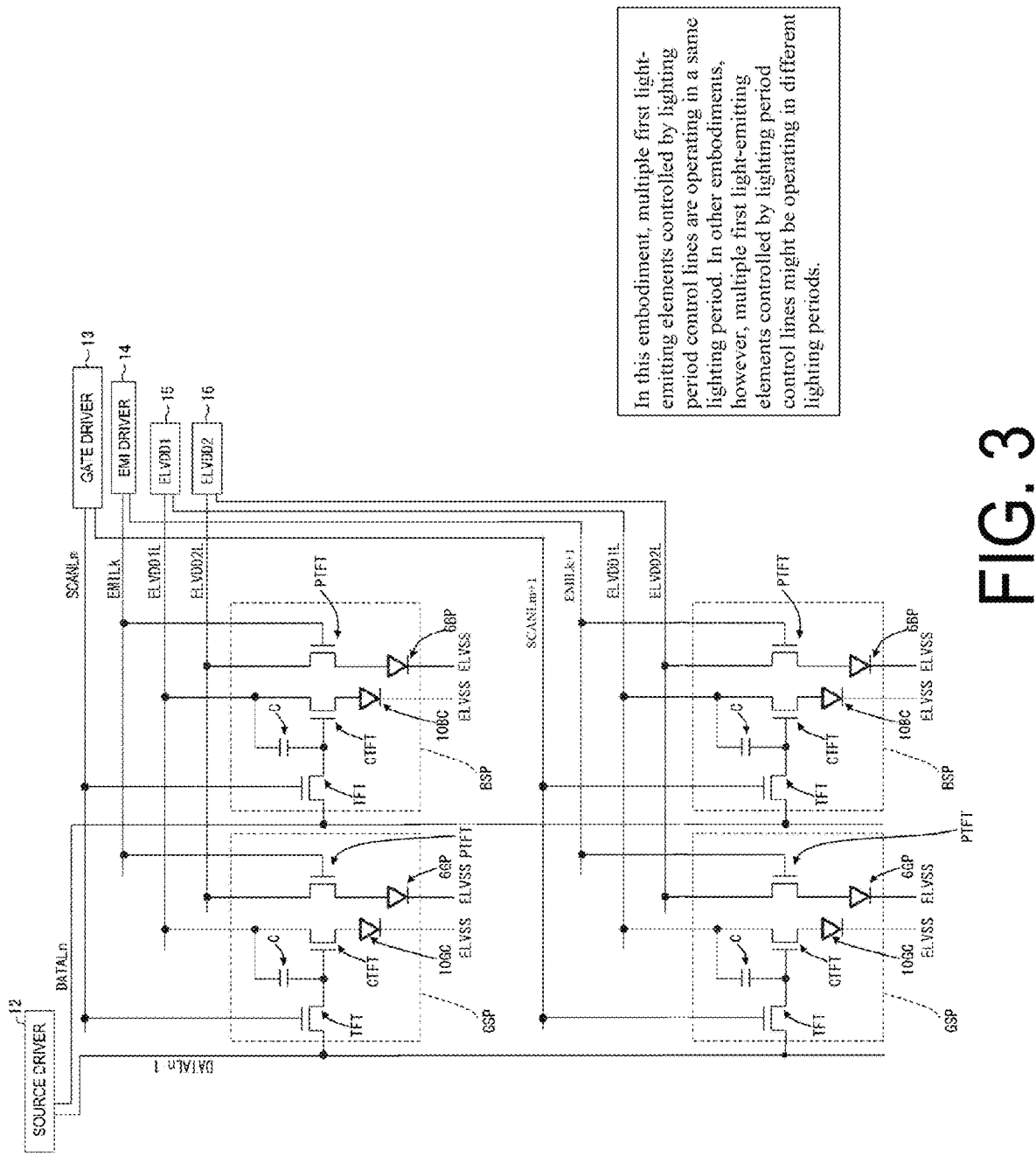
FIG. 3 is a diagram illustrating a schematic configuration of a circuit that drives the light-emitting element driven by changing a pulse width of a pulse width modulation signal and the light-emitting element driven by changing a current value, which are included in each pixel of the display device according to the first embodiment.

FIG. 3 is a diagram illustrating a schematic configuration of a circuit that drives the PWM drive light-emitting elements 6RP, 6GP, and 6BP and the current drive light-emitting elements 10RC, 10GC, and 10BC included in each pixel PIX of the display device 1.

As illustrated in FIG. 3, the display device 1 includes a source driver 12, a gate driver 13, an EMI driver 14, a first power supply ELVDD1 and a second power supply ELVDD2.

Each pixel PIX of the display device 1 includes the red subpixel RSP, the green subpixel GSP, and the blue subpixel BSP, but FIG. 3 illustrates only the green subpixel GSP and the blue subpixel BSP disposed adjacent to each other.

As illustrated in FIG. 3, the green subpixel GSP includes a current controller including a writing control transistor TFT, a capacitance element C, the current drive transistor CTFT, and the current drive green light-emitting element 10GC, and a PWM controller including the PWM transistor PTFT and the PWM drive green light-emitting element 6GP.

In the current controller of the green subpixel GSP, a scanning signal is supplied from the gate driver 13 to the gate electrode of the writing control transistor TFT via a scanning signal line SCANLm (m is a natural number of one or more). A data signal serving as a grayscale signal is supplied from the source driver 12 to the source electrode of the writing control transistor TFT via a data signal line DATALn−1 (n is a natural number of two or more). The drain electrode of the writing control transistor TFT is connected to a first terminal of the capacitance element C, and the gate electrode of the current drive transistor CTFT. The current drive green light-emitting element 10GC is connected to the drain electrode of the current drive transistor CTFT. A first power supply wiring line ELVDD1L from the first power supply ELVDD1 and a second terminal of the capacitance element C are connected to a source electrode of the current drive transistor CTFT. Thus, when the writing control transistor TFT is turned on according to the scanning signal, the data signal is written in the capacitance element C, a current amount from the first power supply ELVDD1 is controlled to a current amount according to the data signal by the current drive transistor CTFT, and a current amount flowing through the current drive green light-emitting element 10GC is controlled according to the data signal, and thus the light emission luminance of the current drive green light-emitting element 10GC can be controlled. Note that a period during which the writing control transistor TFT is on according to the scanning signal, that is, the writing period can be set to, for example, a period obtained by dividing the one frame period by the number of the scanning signal lines SCANLm or less. The light emission luminance of the current drive green light-emitting element 10GC that is written during the writing period is maintained until the next writing is performed.

In the PWM controller of the green subpixel GSP, an EMI signal is supplied from the EMI driver 14 to the gate electrode of the PWM transistor PTFT via a lighting period control line EMILk (k is a natural number of one or more). A source electrode of the PWM transistor PTFT is connected to a second power supply wiring line ELVDD2L from the second power supply ELVDD2. The drain electrode of the PWM transistor PTFT is connected to the PWM drive green light-emitting element 6GP. The PWM transistor PTFT is turned on/off by the EMI signal, which is a lighting time control signal of the PWM drive green light-emitting element 6GP, and thus, a current amount from the second power supply ELVDD2 is supplied to the PWM drive green light-emitting element 6GP during the on period of the PWM transistor PTFT. Thus, the PWM drive green light-emitting element 6GP can control the light emission luminance during the predetermined period by controlling the lighting period among the predetermined period.

The current controller of the blue subpixel BSP illustrated in FIG. 3 and the current controller of the red subpixel RSP not illustrated have the similar configuration to the current controller of the green subpixel GSP described above, and the PWM controller of the blue subpixel BSP illustrated in FIG. 3 and the PWM controller of the red subpixel RSP not illustrated have the similar configuration to the PWM controller of the green subpixel GSP described above.

As illustrated in FIG. 3, in the display device 1 according to the present embodiment, data signal lines DATALn−1 and DATALn different from each other are connected to respective source electrodes of the plurality of writing control transistors TFT connected to the same scanning signal line SCANLm.

In the present embodiment, as illustrated in FIG. 3, a case will be described as an example in which the PWM transistor PTFT provided in each of the red subpixel RSP, the green subpixel GSP, and the blue subpixel BSP of each pixel PIX of the display device 1 is driven by the EMI signal having the same duty ratio, but the present embodiment is not limited thereto. Note that in the present embodiment, the lighting period control lines EMILk are provided by a number of the scanning signal lines SCANLm, and the EMI signal having the same duty ratio is supplied from the EMI driver 14 to each of the lighting period control lines EMILk. That is, in the present embodiment, the EMI signal having the same duty ratio is supplied to all subpixels of all pixels in the screen.

However, the present embodiment is not limited thereto. For example, the lighting period control line may be a wiring line that can supply different EMI signals to the pixels PIX, and may be a wiring line that can supply a different EMI signal to each of the red subpixel RSP, the green subpixel GSP, and the blue subpixel BSP. As described below, for example, an EMI signal having a different duty ratio may be supplied to each of the plurality of lighting period control lines EMILk.

Note that a period during which the writing control transistor TFT is on according to the scanning signal, that is, the writing period is, for example, a period obtained by dividing the one frame period by the number of the scanning signal lines SCANLm. In the display device 1 according to the present embodiment, a case will be described as an example in which the PWM transistor PTFT is turned on in accordance with a start timing of the writing period, that is, a timing at which the writing control transistor TFT is turned on, and the PWM transistor PTFT is turned off within a period from the timing at which the writing control transistor TFT is turned on to a timing at which the writing control transistor TFT is turned on next time (for example, within the one frame period), however, the present embodiment is not limited thereto. For example, the PWM transistor PTFT may be turned on in accordance with a timing at which the writing control transistor TFT is turned off after the writing control transistor TFT is turned on, and the PWM transistor PTFT may be turned off within a period from the timing at which the writing control transistor TFT is turned off to the timing at which the writing control transistor TFT is turned on next time.

For example, the PWM transistor PTFT may be turned on and off twice within a period from the timing at which the writing control transistor TFT is turned on to the timing at which the writing control transistor TFT is turned on next time (for example, within the one frame period) by setting a drive frequency of the EMI signal for controlling the PWM transistor PTFT to 120 Hz and setting a driving frequency of the scanning signal for controlling the writing control transistor TFT to 60 Hz.

Note that in a case where a number of the current drive light-emitting elements is increased by two times for the purpose of securing luminance, a number of pixel circuits (including a drive TFT, a capacitor, a switching TFT, and the like) is also required to be two times in order to normally current-drive these current drive light-emitting elements, but in a case where the PWM drive light-emitting element and the current drive light-emitting element are combined to be driven as described above, the circuit configuration can be simplified and the cost reduction and yield improvement can be expected.

Figure 4:
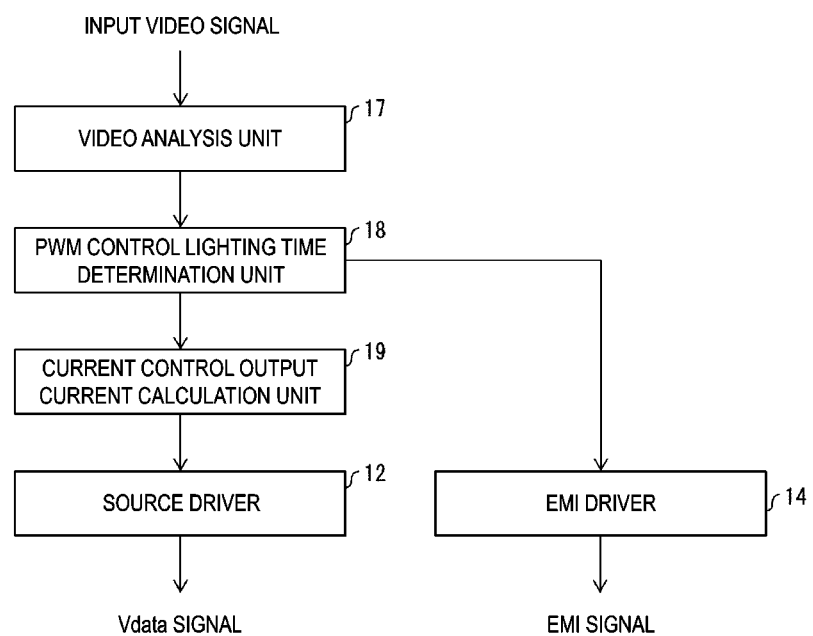
FIG. 4 is a diagram illustrating a schematic configuration of an input video signal processor provided in the display device according to the first embodiment.

FIG. 4 is a diagram illustrating a schematic configuration of an input video signal processor provided in the display device 1 according to the first embodiment.

As illustrated in FIG. 4, the input video signal processor provided in the display device 1 includes a video analysis unit 17 that analyzes the input video signal, a PWM control lighting time determination unit 18 that determines lighting time of the PWM drive light-emitting elements 6RP, 6GP, and 6BP based on a result of video analysis by the video analysis unit 17, and a current control output current calculation unit 19 that calculates a current value for driving the current drive light-emitting elements 10RC, 10GC, and 10BC based on the lighting period of the PWM drive light-emitting elements 6RP, 6GP, and 6BP determined by the PWM control lighting time determination unit 18.

Figure 5:
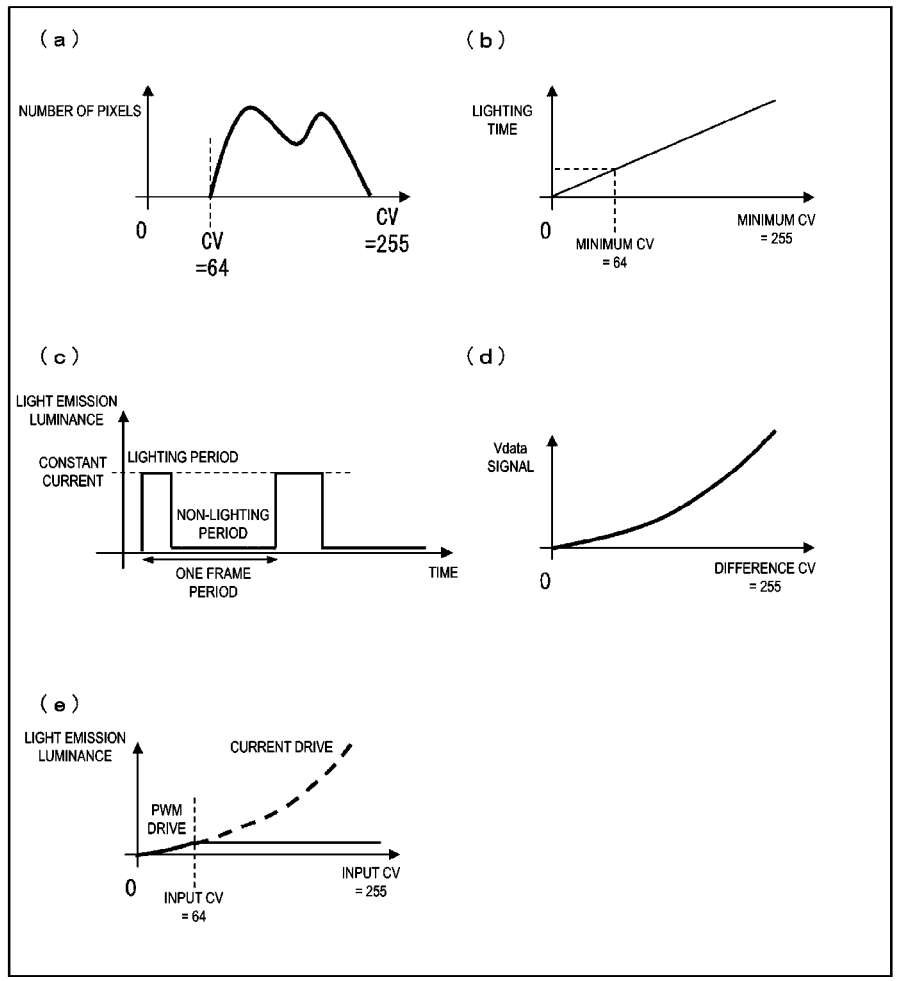
FIGS. 5(a), (b), (c), (d), and (e) are diagrams for describing signal processing performed in the input video signal processor provided in the display device according to the first embodiment.

(a) of FIG. 5, (b) of FIG. 5, (c) of FIG. 5, (d) of FIG. 5, and (e) of FIG. 5 are diagrams for describing signal processing performed in the input video signal processor provided in the display device 1 according to the first embodiment.

As described above, in the present embodiment, a case will be described as an example in which all of the PWM transistors PTFT provided in the red subpixel RSP, the green subpixel GSP, and the blue subpixel BSP of each pixel PIX are driven by the EMI signal having the same duty ratio.

The video analysis unit 17 illustrated in FIG. 4 performs analysis in units of input video signals for one screen supplied to all of the pixels PIX in the display region of the display device 1. For example, a histogram as shown in (a) of FIG. 5 can be obtained that shows an analysis result of the input video signal for one screen. The histogram shown in (a) of FIG. 5 is data indicating the number of corresponding pixels (number of corresponding subpixels) for each grayscale value (CV) corresponding to luminance in each of the red subpixel RSP, the green subpixel GSP, and the blue subpixel BSP. In the case of the histogram shown in (a) of FIG. 5, a grayscale value (CV) of the subpixel corresponding to the minimum luminance in the input video signal for one screen is 64.

That is, in the input video signal for one screen, the grayscale value (CV) of each subpixel is 64 or greater.

The video analysis unit 17 illustrated in FIG. 4 transmits, to the PWM control lighting time determination unit 18 illustrated in FIG. 4, the result of the video analysis that the grayscale value (CV) of the subpixel corresponding to the minimum luminance in the input video signal for one screen is 64. The PWM control lighting time determination unit 18 determines a lighting time when the minimum grayscale value (minimum CV) is 64, by using the transmitted result of the video analysis. Note that in the present embodiment, a look-up table in which the minimum grayscale value (minimum CV) as shown in (b) of FIG. 5 is input, and the lighting time is output is used to determine the lighting time, but the present embodiment is not limited thereto. The lighting time may be calculated by calculation. As shown in (b) of FIG. 5, the higher the minimum grayscale value (minimum CV), the longer the lighting time.

The EMI driver 14 illustrated in FIG. 4 generates the EMI signal as shown in (c) of FIG. 5 based on data related to the lighting time transmitted from the PWM control lighting time determination unit 18, and supplies the EMI signal to the PWM transistor PTFT provided in each of the red subpixel RSP, the green subpixel GSP, and the blue subpixel BSP of each pixel PIX. Note that ideally, the lighting period of the EMI signal can be finely set, but may be adjusted in a range having a few stages for simplicity of processing. For example, the lighting period may be set with 32 stages in advance, and the EMI signal may be generated according to the set lighting period.

The current control output current calculation unit 19 illustrated in FIG. 4 subtracts 64, which is the minimum grayscale value (minimum CV) of the subpixel corresponding to the minimum luminance in the input video signal for one screen, from the grayscale value (CV) in each of the red subpixel RSP, the green subpixel GSP, and the blue subpixel BSP included in the input video signal for one screen, and calculates a difference grayscale value (difference CV) in each of the red subpixel RSP, the green subpixel GSP, and the blue subpixel BSP included in the input video signal for one screen. Note that in the present embodiment, the current value for driving the current drive light-emitting elements 10RC, 10GC, and 10BC is determined by using the look-up table in which the difference grayscale value (difference CV) is input and the current value for driving the current drive light-emitting elements 10RC, 10GC, and 10BC is output, but the present embodiment is not limited thereto. The current value for driving the current drive light-emitting elements 10RC, 10GC, and 10BC may be calculated by calculation. The current value determined by the current control output current calculation unit 19 is transmitted to the source driver 12. The source driver 12 uses the transmitted current value to generate a data signal (Vdata signal) based on the current value for driving the current drive light-emitting elements 10RC, 10GC, and 10BC, and supplies the data signal corresponding to the writing control transistor TFT provided in each of the red subpixel RSP, the green subpixel GSP, and the blue subpixel BSP of each pixel PIX.

That is, in the current control output current calculation unit 19 and the source driver 12 illustrated in FIG. 4, a data signal (Vdata signal) corresponding to the difference grayscale value (difference CV) calculated by the current control output current calculation unit 19 is generated by the source driver 12 as shown in (d) of FIG. 5, and supplies the data signal corresponding to the writing control transistor TFT provided in each of the red subpixel RSP, the green subpixel GSP, and the blue subpixel BSP of each pixel PIX.

Thus, in the display device 1 according to the present embodiment, as shown in (e) of FIG. 5, every PWM transistor PTFT provided in each of the red subpixel RSP, the green subpixel GSP, and the blue subpixel BSP of each pixel PIX is driven by the EMI signal having the same duty ratio so that each of the PWM drive red light-emitting element 6RP, the PWM drive green light-emitting element 6GP, and the PWM drive blue light-emitting element 6BP included in every pixel PIX of the display device 1 has light emission luminance corresponding to the same grayscale value (CV) 64.

With respect to a subpixel in which the grayscale value (CV) of the red subpixel RSP, the green subpixel GSP, and the blue subpixel BSP of each pixel PIX in the input video signal for one screen is greater than 64, the light emission luminance obtained by current-driving the current drive light-emitting elements 10RC, 10GC, and 10BC provided in the corresponding subpixel is added.

In the present embodiment, from the perspective of maintaining white balance, each of the PWM drive red light-emitting element 6RP, the PWM drive green light-emitting element 6GP, and the PWM drive blue light-emitting element 6BP included in every pixel PIX has the light emission luminance corresponding to the same grayscale value (CV), however, the present embodiment is not limited thereto. For example, in a case where the grayscale value (CV) of the subpixel corresponding to the minimum luminance is obtained for each of the subpixels of respective colors in the input video signal for one screen, that is, in a case where the grayscale value (CV) of one subpixel corresponding to the minimum luminance in all the red subpixels is obtained, the grayscale value (CV) of one subpixel corresponding to the minimum luminance in all the green subpixels is obtained, and the grayscale value (CV) of one subpixel corresponding to the minimum luminance in all the blue subpixels is obtained, each of the PWM drive red light-emitting element 6RP, the PWM drive green light-emitting element 6GP, and the PWM drive blue light-emitting element 6BP included in each pixel PIX may be emitted at the light emission luminance corresponding to the grayscale value (CV) of the subpixel corresponding to the minimum luminance obtained for each of the subpixels of respective colors.

As described above, the display device 1 according to the present embodiment includes the pixel PIX including the PWM drive light-emitting elements 6RP, 6GP, and 6BP in which the light emission luminance during the predetermined period is controlled by controlling the lighting period among the predetermined period, and the current drive light-emitting elements 10RC, 10GC, and 10BC in which the light emission luminance is controlled by controlling the current value. Thus, in the display device 1 according to the present embodiment, the minimum luminance of the pixel PIX can be secured by causing the PWM drive light-emitting elements 6RP, 6GP, and 6BP to emit light by a PWM-driving method having high luminous efficiency, and the luminance of a portion exceeding the minimum luminance can be secured using the current drive light-emitting elements 10RC, 10GC, and 10BC in which the light emission luminance is controlled by controlling the current value. Thus, the display device 1 with improved grayscale reproducibility in each pixel PIX can be achieved. With proactive use of the light emission of the PWM drive light-emitting element, a current density applied to the current drive light-emitting element can be reduced, leading to suppression of degradation of the current drive light-emitting element. Furthermore, it is possible to increase a moving picture blur reduction effect by driving the PWM drive light-emitting element.

Note that in the present embodiment, the video analysis unit 17 outputs, as the result of the video analysis, the grayscale value (CV) of the subpixel corresponding to the minimum luminance in the input video signal for one screen, however, the present embodiment is not limited thereto. For example, the video analysis unit 17 may output, as the result of the video analysis, a grayscale value higher than the grayscale value of the subpixel corresponding to the minimum luminance in the input video signal for one screen. More specifically, for example, the video analysis unit 17 may output, as the result of the video analysis, the grayscale value (CV) of an n-th (n is a natural number) pixel from dark side in the input video signal for one screen. With this configuration, a ratio of the light emission by the PWM control can be further increased.

Figure 6:
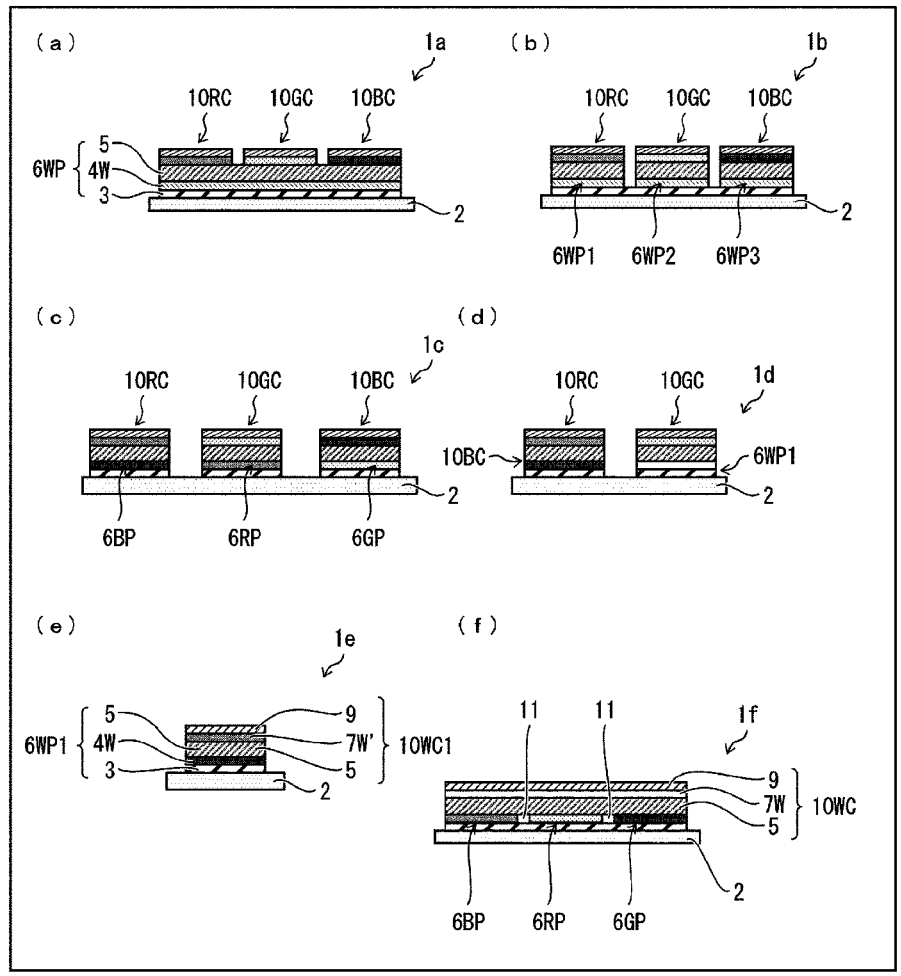

(a) of FIG. 6, (b) of FIG. 6, (c) of FIG. 6, (d) of FIG. 6, (e) of FIG. 6, and (f) of FIG. 6 are cross-sectional views illustrating schematic configurations of one pixel of display devices 1*a*, 1*b*, 1*c*, 1*d*, 1*e*, and 1*f*, respectively, that are modified examples of the first embodiment.

One pixel of the display device 1*a* illustrated in (a) of FIG. 6 includes a PWM drive white light-emitting element 6WP provided on the active substrate 2, a current drive red light-emitting element 10RC provided on the PWM drive white light-emitting element 6WP, a current drive green light-emitting element 10GC provided on the PWM drive white light-emitting element 6WP, and a current drive blue light-emitting element 10BC provided on the PWM drive white light-emitting element 6WP.

The PWM drive white light-emitting element 6WP is provided in the entirety of the one pixel, and each of the current drive red light-emitting element 10RC, the current drive green light-emitting element 10GC, and the current drive blue light-emitting element 10BC overlaps a different part of the PWM drive white light-emitting element 6WP.

The PWM drive white light-emitting element 6WP includes the anode electrode 3, the cathode electrode 5, and a function layer 4W that is including a white light-emitting layer and that is provided between the anode electrode 3 and the cathode electrode 5.

One pixel of the display device 1b illustrated in (b) of FIG. 6 includes a PWM drive white light-emitting element 6WP1 provided on the active substrate 2, a PWM drive white light-emitting element 6WP2 provided on the active substrate 2, a PWM drive white light-emitting element 6WP3 provided on the active substrate 2, a current drive red light-emitting element 10RC provided on the PWM drive white light-emitting element 6WP1, a current drive green light-emitting element 10GC provided on the PWM drive white light-emitting element 6WP2, and a current drive blue light-emitting element 10BC provided on the PWM drive white light-emitting element 6WP3.

Each of the PWM drive white light-emitting element 6WP1, the PWM drive white light-emitting element 6WP2, and the PWM drive white light-emitting element 6WP3 includes the anode electrode 3 formed as a common electrode, the cathode electrode 5 individually formed, and the function layer 4W that is including the white light-emitting layer and that is individually provided between the anode electrode 3 and the cathode electrode 5.

One pixel of the display device 1c illustrated in (c) of FIG. 6 includes the PWM drive blue light-emitting element 6BP provided on the active substrate 2, the PWM drive red light-emitting element 6RP provided on the active substrate 2, the PWM drive green light-emitting element 6GP provided on the active substrate 2, a current drive red light-emitting element 10RC provided on the PWM drive blue light-emitting element 6BP, a current drive green light-emitting element 10GC provided on the PWM drive red light-emitting element 6RP, and a current drive blue light-emitting element 10BC provided on the PWM drive green light-emitting element 6GP. An arrangement order for each color of the current drive light-emitting elements 10RC, 10GC, and 10BC, which are upper stages in the one pixel is different from an arrangement order for each color of the PWM drive light-emitting elements 6BP, 6RP, and 6GP, which are lower stages.

One pixel of the display device 1d illustrated in (d) of FIG. 6 includes the current drive blue light-emitting element 10BC provided on the active substrate 2, the PWM drive white light-emitting element 6WP1 provided on the active substrate 2, the current drive red light-emitting element 10RC provided on the current drive blue light-emitting element 10BC, and the current drive green light-emitting element 10GC provided on the PWM drive white light-emitting element 6WP1.

The display device 1e illustrated in (e) of FIG. 6 is a monochrome display device (a black-and-white display device). One pixel of the display device 1e includes the PWM drive white light-emitting element 6WP1 provided on the active substrate 2 and a current drive white light-emitting element 10WC1 provided on the PWM drive white light-emitting element 6WP1.

Note that the PWM drive white light-emitting element 6WP1 includes the anode electrode 3, the cathode electrode 5, and the function layer 4W that is including the white light-emitting layer and that is provided between the anode electrode 3 and the cathode electrode 5. The current drive white light-emitting element 10WC1 includes the cathode electrode 5, the anode electrode 9, and a function layer 7W' that is including the white light-emitting layer and that is provided between the cathode electrode 5 and the anode electrode 9.

One pixel of a display device 1f illustrated in (f) of FIG. 6 includes the PWM drive blue light-emitting element 6BP provided on the active substrate 2, the PWM drive red light-emitting element 6RP provided on the active substrate 2, the PWM drive green light-emitting element 6GP provided on the active substrate 2, and a current drive white light-emitting element 10WC provided on the PWM drive blue light-emitting element 6BP, the PWM drive red light-emitting element 6RP, and the PWM drive green light-emitting element 6GP.

The current drive white light-emitting element 10WC is provided in the entirety of the one pixel, and overlaps each of the PWM drive blue light-emitting element 6BP, the PWM drive red light-emitting element 6RP, and the PWM drive green light-emitting element 6GP, which can be individually driven.

Edge covers (banks) 11 are provided between the PWM drive blue light-emitting element 6BP and the PWM drive red light-emitting element 6RP, and between the PWM drive red light-emitting element 6RP and the PWM drive green light-emitting element 6GP.

Note that, the current drive white light-emitting element 10WC includes the cathode electrode 5, the anode electrode 9, and a function layer 7W that is including the white light-emitting layer and that is provided between the cathode electrode 5 and the anode electrode 9.

Each of the display devices 1a, 1b, 1c, 1d, 1e, and 1f illustrated in a respective one of (a) of FIG. 6, (b) of FIG. 6, (c) of FIG. 6, (d) of FIG. 6, (e) of FIG. 6, and (f) of FIG. 6 includes a display region including a plurality of the pixels described above.

Each of the plurality of pixels of the display devices 1a, 1b, 1d, and 1e includes one or more of the PWM drive white light-emitting elements 6WP, 6WP1, 6WP2, and 6WP3. Each of the plurality of pixels of the display devices 1c and 1f includes the PWM drive red light-emitting element 6RP, the PWM drive green light-emitting element 6GP, and the PWM drive blue light-emitting element 6BP.

A case will be described as an example in which each of the plurality of pixels of the display devices 1a, 1b, 1c, and 1d includes one or more of the PWM drive light-emitting elements 6WP, 6WP1, 6WP2, 6WP3, 6RP, 6GP, and 6BP, and in the present embodiment, all of the PWM drive light-emitting elements 6WP, 6WP1, 6WP2, 6WP3, 6RP, 6GP, and 6BP included in each of the plurality of pixels are driven by the EMI signal having the same duty ratio, that is, driven in the same lighting period. In such a case, the PWM drive light-emitting elements 6WP, 6WP1, 6WP2, 6WP3, 6RP, 6GP, and 6BP included in each of the plurality of pixels may be driven in the same lighting time corresponding to the grayscale value (CV) of the subpixel corresponding to the minimum luminance in the input video signal for one screen. Note that in a case where a grayscale value (CV) of a subpixel of each color is greater than the grayscale value (CV) of the subpixel corresponding to the minimum luminance in the input video signal for one screen, a current value corresponding to the difference grayscale value (difference CV) drives each of the current drive red light-emitting element 10RC, the current drive green light-emitting element 10GC, and the current drive blue light-emitting element 10BC provided in each of the plurality of pixels of the display devices 1a, 1b, 1c, and 1d, and the obtained light emission luminance is added.

The present embodiment is not limited thereto, and, for example, in a case where each of the plurality of pixels includes three PWM drive light-emitting elements 6RP, 6GP, and 6BP as in the display device 1c, the three PWM drive light-emitting elements 6RP, 6GP, and 6BP included in each pixel may be driven by respective different EMI signals, that is, driven in different lighting period. Note that in this case, each of the three PWM drive light-emitting elements 6RP, 6GP, and 6BP provided in each pixel may be driven in the lighting time corresponding to the grayscale value (CV) of the subpixel corresponding to the minimum luminance obtained for each of the subpixels of respective colors in the input video signal for one screen. In this case as well, in a case where a grayscale value (CV) of a subpixel of each color is greater than the grayscale value (CV) of the subpixel corresponding to the minimum luminance in the input video signal for one screen, a current value corresponding to the difference grayscale value (difference CV) drives each of the current drive red light-emitting element 10RC, the current drive green light-emitting element 10GC, and the current drive blue light-emitting element 10BC, and the obtained light emission luminance is added.

A case will be described as an example in which each of the plurality of pixels of the display device 1e, which is the monochrome display device, includes one PWM drive white light-emitting element 6WP1, and in the present embodiment, every PWM drive white light-emitting element 6WP1 included in each of the plurality of pixels is driven by the EMI signal having the same duty ratio, that is, driven in the same lighting period. In such a case, the PWM drive white light-emitting elements 6WP1 included in each of the plurality of pixels may be driven in the same lighting time corresponding to a grayscale value (CV) of one pixel corresponding to the minimum luminance in the input video signal for one screen. Since the display device 1e is the monochrome display device, the grayscale value (CV) of the one pixel corresponding to the minimum luminance is obtained in the input video signal for one screen. In a case where a grayscale value (CV) of a corresponding one pixel is greater than the grayscale value (CV) of the pixel corresponding to the minimum luminance in the input video signal for one screen, a current value corresponding to the difference grayscale value (difference CV) drives the current drive white light-emitting element 10WC1, and the obtained light emission luminance is added.

In the present embodiment, a case will be described in which the display device 1f is used as the monochrome display device. A case will be described as an example in which each of the plurality of pixels of the display device 1f includes three PWM drive red light-emitting element 6RP, the PWM drive green light-emitting element 6GP, and the PWM drive blue light-emitting element 6BP, and in the present embodiment, all of the PWM drive red light-emitting element 6RP, the PWM drive green light-emitting element 6GP, and the PWM drive blue light-emitting element 6BP included in each of the plurality of pixels are driven by the EMI signal having the same duty ratio, that is, driven in the same lighting period. In such a case, the PWM drive red light-emitting element 6RP, the PWM drive green light-emitting element 6GP, and the PWM drive blue light-emitting element 6BP included in each of the plurality of pixels may be driven in the same lighting time corresponding to the grayscale value (CV) of the one pixel corresponding to the minimum luminance in the input video signal for one screen. In a case where a grayscale value (CV) of a corresponding one pixel is greater than the grayscale value (CV) of the pixel corresponding to the minimum luminance in the input video signal for one screen, a current value corresponding to the difference grayscale value (difference CV) drives the current drive white light-emitting element 10WC, and the obtained light emission luminance is added.

As described above, each of the display devices 1a, 1b, 1c, 1d 1e, and 1f that are the modified examples of the present embodiment includes the pixel PIX including the PWM drive light-emitting elements 6WP, 6WP1, 6WP2, 6WP3, 6RP, 6GP, and 6BP in which the light emission luminance during the predetermined period is controlled by controlling the lighting period among the predetermined period, and the current drive light-emitting elements 10RC, 10GC, 10BC, 10WC, and 10WC1 in which the light emission luminance is controlled by controlling the current value. Thus, in the display devices 1a, 1b, 1c, 1d, 1e, and 1f, the minimum luminance of the pixel PIX can be secured by causing the PWM drive light-emitting elements 6WP, 6WP1, 6WP2, 6WP3, 6RP, 6GP, and 6BP to emit light by a PWM-driving method having high luminous efficiency, and the luminance of a portion exceeding the minimum luminance can be secured using the current drive light-emitting elements 10RC, 10GC, 10BC, 10WC, and 10WC1 in which the light emission luminance is controlled by controlling the current value. Thus, the display devices 1a, 1b, 1c, 1d, 1e, and 1f with improved grayscale reproducibility in each pixel can be achieved. With proactive use of the light emission of the PWM drive light-emitting element, a current density applied to the current drive light-emitting element can be reduced, leading to suppression of degradation of the current drive light-emitting element. Furthermore, it is possible to increase a moving picture blur reduction effect by driving the PWM drive light-emitting element.

Second Embodiment

Next, with reference to FIG. 7 to FIG. 9, a second embodiment of the disclosure will be described. A display device 20 according to the present embodiment is different from that of the first embodiment in that PWM drive light-emitting elements 6RP', 6GP', and 6BP' and current drive light-emitting element 10RC', 10GC', and 10BC', which are included in each pixel PIX do not overlap each other in a plan view, and the other details are as described in the first embodiment. For convenience of explanation, components having the same functions as those illustrated in diagrams of the first embodiment are appended with the same reference signs, and descriptions thereof may be omitted.

Figure 7:
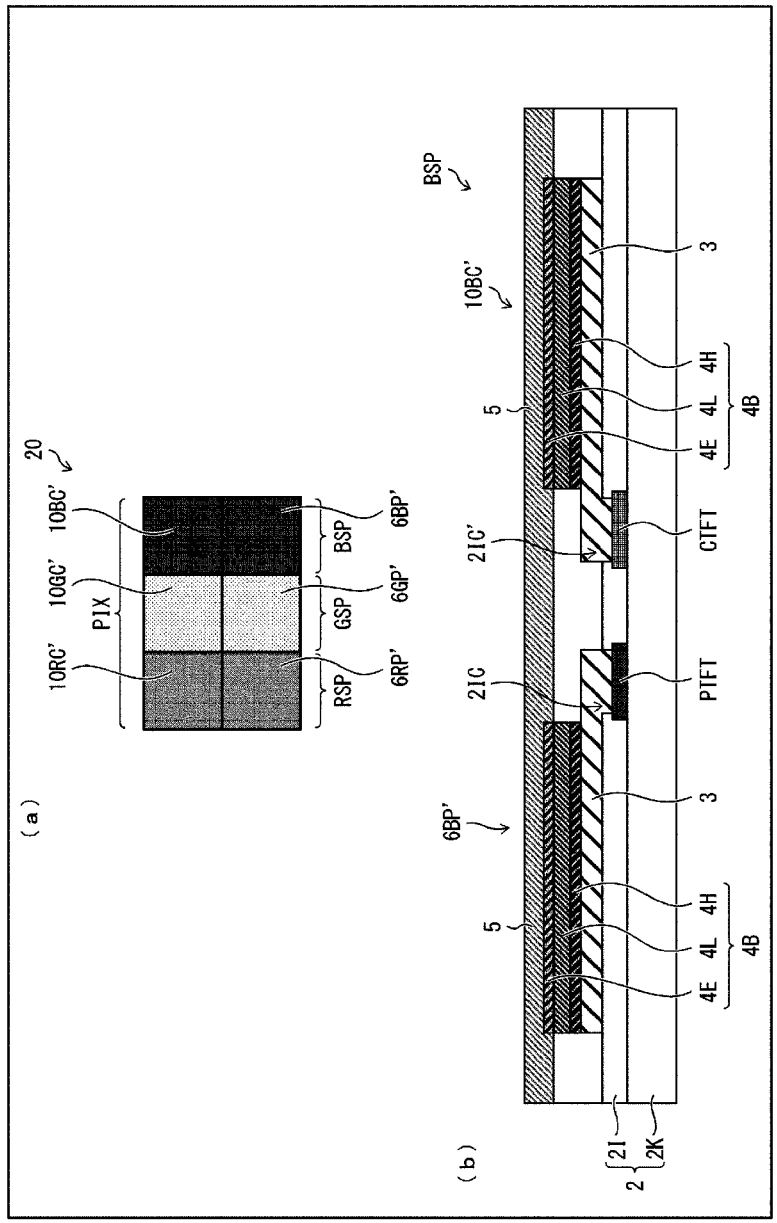

(a) of FIG. 7 is a plan view illustrating one pixel PIX of the display device 20, and (b) of FIG. 7 is a cross-sectional view illustrating a schematic configuration of the blue subpixel BSP included in the one pixel PIX of the display device 20.

As illustrated in (a) of FIG. 7, the one pixel PIX of the display device 20 includes the red subpixel RSP, the green subpixel GSP, and the blue subpixel BSP. Note that, although not illustrated, the display device 20 includes a display region including a plurality of the pixels PIX. In the display device 20 of the present embodiment, a case will be described as an example in which one pixel PIX includes the red subpixel RSP provided with the PWM drive red light-emitting element 6RP' and the current drive red light-emitting element 10RC', the green subpixel GSP provided with the PWM drive green light-emitting element 6GP' and a current drive green light-emitting element 10GC', and the blue subpixel BSP provided with the PWM drive blue light-emitting element 6BP' and the current drive blue light-emitting element 10BC', but the present embodiment is not limited thereto. The one pixel PIX may further include a subpixel of another color.

As illustrated in (a) of FIG. 7 and (b) of FIG. 7, the display device 20 includes the substrate 2K, the thin film transistor layer 21 provided on the substrate 2K, and the PWM drive red light-emitting element 6RP', the current drive red light-emitting element 10RC', the PWM drive green light-emitting element 6GP', the current drive green light-emitting element 10GC', the PWM drive blue light-emitting element 6BP', and the current drive blue light-emitting element 10BC', which do not overlap each other in a plan view.

Each of the anode electrode 3 of the PWM drive red light-emitting element 6RP', the anode electrode 3 of the PWM drive green light-emitting element 6GP', and the anode electrode 3 of the PWM drive blue light-emitting element 6BP', which are provided in each pixel PIX, is electrically connected to a drain electrode of the PWM transistor PTFT provided for each of the subpixels of respective colors via a contact hole 2IC provided in an interlayer insulating film.

Each of the anode electrode 3 of the current drive red light-emitting element 10RC' the anode electrode 3 of the current drive green light-emitting element 10GC', and the anode electrode 3 of the current drive blue light-emitting element 10BC', which are provided in each pixel PIX, is electrically connected to a drain electrode of the current drive transistor CTFT provided for each of the subpixels of respective colors via a contact hole 2IC' provided in an interlayer insulating film.

As illustrated in (b) of FIG. 7, in the display device 20 according to the present embodiment, a case will be described as an example in which each of the current drive blue light-emitting element 10BC' and the PWM drive blue light-emitting element 6BP' includes the function layer 4B including the blue light-emitting layer made of the same material, each of the current drive red light-emitting element 10RC' and the PWM drive red light-emitting element 6RP' includes a function layer including a red light-emitting layer made of the same material, and each of the current drive green light-emitting element 10GC' and the PWM drive green light-emitting element 6GP' includes a function layer including a green light-emitting layer made of the same material. However, the present embodiment is not limited thereto.

In the present embodiment, the display device 20 is a top-emission type display device, and thus for example, an electrode formed by layering Indium Tin Oxide (ITO) and silver (Ag) and reflecting visible light can be used as the anode electrode 3. For example, an electrode formed of a metal thin film such as a magnesium-silver alloy and transmitting visible light can be used as the cathode electrode 5. The present embodiment is not limited thereto, and for example, the display device 20 may be a bottom-emission type display device by reversing the layering order from the anode electrode 3 formed of the material transmitting visible light to the cathode electrode 5 formed of the material reflecting visible light.

In the present embodiment, a case will be described as an example in which each of the PWM drive red light-emitting element 6RP', the PWM drive green light-emitting element 6GP', the PWM drive blue light-emitting element 6BP' the current drive red light-emitting element 10RC', the current drive green light-emitting element 10GC', and the current drive blue light-emitting element 10BC' is the QLED including quantum dots as the light-emitting layer, however the present embodiment is not limited thereto. For example, each of the PWM drive red light-emitting element 6RP', the PWM drive green light-emitting element 6GP', the PWM drive blue light-emitting element 6BP' the current drive red light-emitting element 10RC', the current drive green light-emitting element 10GC', and the current drive blue light-emitting element 10BC' may be the OLED or the Micro LED. Furthermore, for example, the PWM drive red light-emitting element 6RP', the PWM drive green light-emitting element 6GP', the PWM drive blue light-emitting element 6BP' the current drive red light-emitting element 10RC', the current drive green light-emitting element 10GC', and the current drive blue light-emitting element 10BC' may be configured by the QLED and the OLED, may be configured by the QLED and the Micro LED, may be configured by the OLED and the Micro LED, or may be configured by the QLED, the OLED and the Micro LED.

In the display device 20 according to the present embodiment, a case will be described as an example in which the cathode electrode 5 is formed as a common cathode electrode in the PWM drive light-emitting elements 6RP', 6GP', and 6BP' and the current drive light-emitting elements 10RC', 10GC', and 10BC', but the present embodiment is not limited thereto. The cathode electrode may be separately formed into a cathode electrode of the PWM drive light-emitting elements 6RP', 6GP', and 6BP' and a cathode electrode of the current drive light-emitting elements 10RC', 10GC', and 10BC'.

The display device 20 according to the present embodiment includes the pixel PIX including the PWM drive light-emitting elements 6RP', 6GP', and 6BP' in which the light emission luminance during the predetermined period is controlled by controlling the lighting period among the predetermined period, and the current drive light-emitting elements 10RC', 10GC', and 10BC' in which the light emission luminance is controlled by controlling the current value. Thus, in the display device 20 according to the present embodiment, the minimum luminance of the pixel PIX can be secured by causing the PWM drive light-emitting elements 6RP', 6GP', and 6BP' to emit light by the PWM-driving method having high luminous efficiency, and the luminance of a portion exceeding the minimum luminance can be secured using the current drive light-emitting elements 10RC', 10GC', and 10BC' in which the light emission luminance is controlled by controlling the current value. Thus, the display device 20 with improved grayscale reproducibility in each pixel can be achieved.

Figure 8:
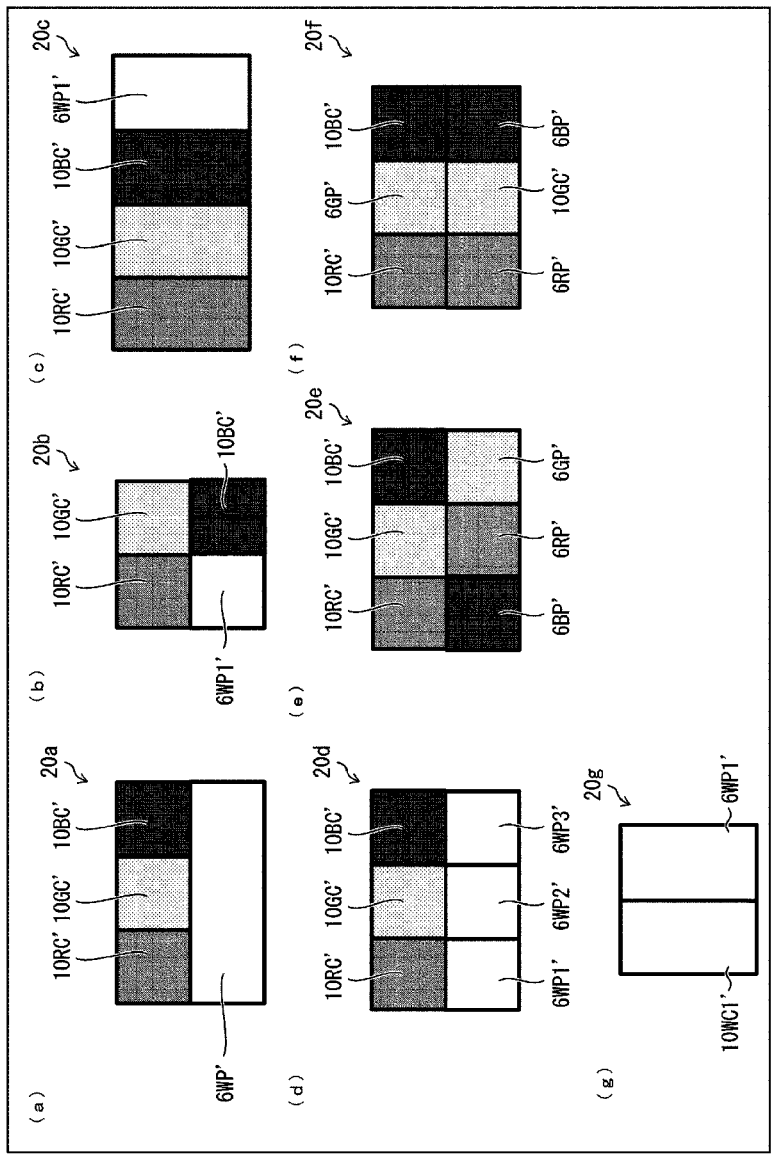

Each of (a) of FIG. 8, (b) of FIG. 8, (c) of FIG. 8, (d) of FIG. 8, (e) of FIG. 8, (f) of FIG. 8. and (g) of FIG. 8 is a plan view illustrating one pixel of a respective one of display devices 20a to 20g that are modified examples according to the second embodiment.

Figure 9:
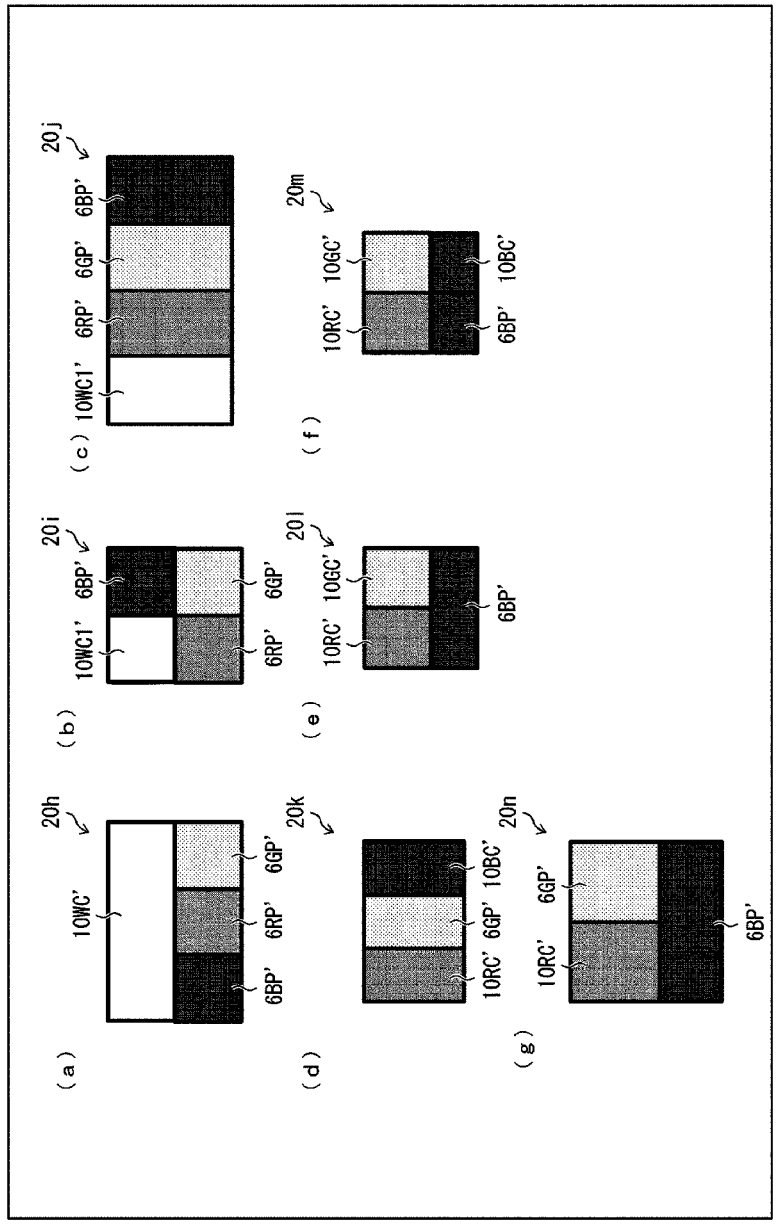

Each of (a) of FIG. 9, (b) of FIG. 9, (c) of FIG. 9, (d) of FIG. 9, (e) of FIG. 9, (f) of FIG. 9. and (g) of FIG. 9 is a plan view illustrating one pixel of a respective one of display devices 20*h* to 20*n* that are further other modified examples according to the second embodiment.

One pixel of the display device 20*a* illustrated in (a) of FIG. 8 includes the PWM drive white light-emitting element 6WP', the current drive red light-emitting element 10RC', the current drive green light-emitting element 10GC', and the current drive blue light-emitting element 10BC', which do not overlap each other in a plan view. In the present embodiment, a case will be described as an example in which the size of the PWM drive white light-emitting element 6WP' is approximately three times of the size of each of the current drive red light-emitting element 10RC', the current drive green light-emitting element 10GC', and the current drive blue light-emitting element 10BC', but the present embodiment is not limited thereto. The size of the PWM drive white light-emitting element 6WP' may be greater or smaller than the size of each of the current drive red light-emitting element 10RC', the current drive green light-emitting element 10GC, and the current drive blue light-emitting element 10BC'.

One pixel of the display device 20*b* illustrated in (b) of FIG. 8 is square. The one pixel includes the PWM drive white light-emitting element 6WP1', the current drive red light-emitting element 10RC', the current drive green light-emitting element 10GC', and the current drive blue light-emitting element 10BC', which do not overlap each other in a plan view. The size of each of the PWM drive white light-emitting element 6WP1', the current drive red light-emitting element 10RC', the current drive green light-emitting element 10GC', and the current drive blue light-emitting element 10BC' is the same.

One pixel of the display device 20*c* illustrated in (c) of FIG. 8 has a rectangular shape with the vertical width and the horizontal width different from each other. The one pixel includes the PWM drive white light-emitting element 6WP1', the current drive red light-emitting element 10RC', the current drive green light-emitting element 10GC', and the current drive blue light-emitting element 10BC', which do not overlap each other in a plan view. The size of each of the PWM drive white light-emitting element 6WP1', the current drive red light-emitting element 10RC', the current drive green light-emitting element 10GC', and the current drive blue light-emitting element 10BC' is the same.

One pixel of the display device 20*d* illustrated in (d) of FIG. 8 includes the PWM drive white light-emitting element 6WP1', a PWM drive white light-emitting element 6WP2', a PWM drive white light-emitting element 6WP3', the current drive red light-emitting element 10RC', the current drive green light-emitting element 10GC', and the current drive blue light-emitting element 10BC', which do not overlap each other in a plan view. The size of each of the PWM drive white light-emitting element 6WP1', the PWM drive white light-emitting element 6WP2', the PWM drive white light-emitting element 6WP3', the current drive red light-emitting element 10RC', the current drive green light-emitting element 10GC', and the current drive blue light-emitting element 10BC' is the same.

One pixel of the display device 20*e* illustrated in (e) of FIG. 8 includes the PWM drive blue light-emitting element 6BP', the PWM drive red light-emitting element 6RP', the PWM drive green light-emitting element 6GP, the current drive red light-emitting element 10RC', the current drive green light-emitting element 10GC', and the current drive blue light-emitting element 10BC', which do not overlap each other in a plan view. An arrangement order for respective colors of the current drive light-emitting elements 10RC', 10GC', and 10BC', which are in the upper stage in the one pixel, is different from an arrangement order for respective colors of the PWM drive light-emitting elements 6BP', 6RP', and 6GP', which are in the lower stage.

One pixel of the display device 20*f* illustrated in (f) of FIG. 8 includes the PWM drive blue light-emitting element 6BP', the PWM drive red light-emitting element 6RP', the PWM drive green light-emitting element 6GP', the current drive red light-emitting element 10RC', the current drive green light-emitting element 10GC', and the current drive blue light-emitting element 10BC', which do not overlap each other in a plan view. The upper stage and the lower stage in the one pixel have the same arrangement order for respective colors, but the current drive light-emitting elements and the PWM drive light-emitting elements are alternately arranged.

The display device 20*g* illustrated in (g) of FIG. 8 is a monochrome display device (black-and-white display device). One pixel of the display device 20*g* includes the PWM drive white light-emitting element 6WP1' and the current drive white light-emitting element 10WC1'. Note that each of a configuration of the PWM drive white light-emitting element 6WP1' and a configuration of the current drive white light-emitting element 10WC1' includes the anode electrode 3, the cathode electrode 5, and the function layer 4W that is including the white light-emitting layer and that is provided between the anode electrode 3 and the cathode electrode 5.

One pixel of the display device 20*h* illustrated in (a) of FIG. 9 includes the PWM drive blue light-emitting element 6BP', the PWM drive red light-emitting element 6RP', the PWM drive green light-emitting element 6GP', and the current drive white light-emitting element 10WC', which do not overlap each other in a plan view. In the present embodiment, a case will be described as an example in which the size of the current drive white light-emitting element 10WC' is approximately three times of the size of each of the PWM drive blue light-emitting element 6BP', the PWM drive red light-emitting element 6RP', and the PWM drive green light-emitting element 6GP', but the present embodiment is not limited thereto. The size of the current drive white light-emitting element 10WC' may be greater or smaller than the size of each of the PWM drive blue light-emitting element 6BP', the PWM drive red light-emitting element 6RP', and the PWM drive green light-emitting element 6GP'.

One pixel of the display device 20*i* illustrated in (b) of FIG. 9 is square. The one pixel includes the PWM drive blue light-emitting element 6BP', the PWM drive red light-emitting element 6RP', the PWM drive green light-emitting element 6GP', and the current drive white light-emitting element 10WC1', which do not overlap each other in a plan view. The size of each of the PWM drive blue light-emitting element 6BP', the PWM drive red light-emitting element 6RP', the PWM drive green light-emitting element 6GP', and the current drive white light-emitting element 10WC1' is the same.

One pixel of the display device 20*j* illustrated in (c) of FIG. 9 has a rectangular shape with the vertical width and the horizontal width different from each other. The one pixel includes the PWM drive blue light-emitting element 6BP', the PWM drive red light-emitting element 6RP', the PWM drive green light-emitting element 6GP', and the current drive white light-emitting element 10WC1', which do not overlap each other in a plan view. The size of each of the PWM drive blue light-emitting element 6BP', the PWM drive red light-emitting element 6RP', the PWM drive green light-emitting element 6GP', and the current drive white light-emitting element 10WC' is the same.

One pixel of the display device 20k illustrated in (d) of FIG. 9 includes the PWM drive green light-emitting elements 6GP' the current drive red light-emitting element 10RC', and the current drive blue light-emitting element 10BC', which do not overlap each other in a plan view. The size of each of the PWM drive green light-emitting elements 6GP' the current drive red light-emitting element 10RC', and the current drive blue light-emitting element 10BC' is the same.

The reason why the one pixel of the display device 20k has such a configuration is that, in general, green requires a high luminance output as compared with red and blue. For example, R:G:B luminance ratio in displaying white display is required to be 2:7:1, which is high luminance output of green. Thus, the green light emission that requires high luminance output can be secured by emitting the PWM drive green light-emitting element 6GP' by the PWM-driving method having high luminous efficiency.

One pixel of the display device 20l illustrated in (e) of FIG. 9 includes the PWM drive blue light-emitting element 6BP', the current drive red light-emitting element 10RC', and the current drive green light-emitting element 10GC', which do not overlap each other in a plan view. The size (light-emitting area) of the PWM drive blue light-emitting element 6BP' is larger than the size (light-emitting area) of each of the current drive red light-emitting element 10RC' and the current drive green light-emitting element 10GC'.

The reason why the one pixel of the display device 20l has such a configuration is that light emission of blue has lower luminous efficiency as compared with light emission of red and green, and a high current is required to be supplied in order to obtain luminance of blue. Thus, the luminance of blue can be secured by making light-emitting area of blue larger than light-emitting areas of other colors and by causing the PWM drive blue light-emitting element 6BP' to emit light by the PWM-driving method having high luminous efficiency.

One pixel of the display device 20m illustrated in (f) of FIG. 9 includes the PWM drive blue light-emitting element 6BP', the current drive red light-emitting element 10RC', the current drive green light-emitting element 10GC', and the current drive blue light-emitting element 10BC', which do not overlap each other in a plan view. The size (light-emitting area) obtained by adding the PWM drive blue light-emitting element 6BP' and the current drive blue light-emitting element 10BC' is larger than the size (light-emitting area) of each of the current drive red light-emitting element 10RC' and the current drive green light-emitting element 10GC'.

The reason why the one pixel of the display device 20m has such a configuration is that light emission of blue has lower luminous efficiency as compared with light emission of red and green, and a high current is required to be supplied in order to obtain luminance of blue. Thus, a portion of the luminance of blue can be secured by making light-emitting area of blue larger than light-emitting areas of other colors and by causing the PWM drive blue light-emitting element 6BP' to emit light by the PWM-driving method having high luminous efficiency.

One pixel of the display device 20n illustrated in (g) of FIG. 9 includes the PWM drive blue light-emitting element 6BP', the PWM drive green light-emitting element 6GP', and the current drive red light-emitting element 10RC', which do not overlap each other in a plan view.

The reason why the one pixel of the display device 20n has such a configuration is that, as described above, green requires a high luminance output as compared with red and blue. In addition, the reason is that light emission of blue has lower luminous efficiency as compared with light emission of red and green, and a high current is required to be supplied in order to obtain the luminance of blue. Thus, in the case of the display device 20n, the green light emission that requires high luminance output can be secured by emitting the PWM drive green light-emitting element 6GP' by the PWM-driving method having high luminous efficiency. The luminance of blue can be secured by making light-emitting area of blue larger than light-emitting areas of other colors and by causing the PWM drive blue light-emitting element 6BP' to emit light by the PWM-driving method having high luminous efficiency.

Each of the display devices 20a to 20g illustrated in (a) of FIG. 8 to (g) of FIG. 8 and the display devices 20h to 20n illustrated in (a) of FIG. 9 to (g) of FIG. 9 includes a display region including a plurality of the pixels described above.

Each of the plurality of pixels of the display devices 20a, 20b, 20c, 20d, and 20g includes one or more of the PWM drive white light-emitting elements 6WP', 6WP1', 6WP2', and 6WP3', and each of the plurality of pixels of the display devices 20e, 20f, 20h, 20i, and 20j includes the PWM drive red light-emitting element 6RP', the PWM drive green light-emitting element 6GP', and the PWM drive blue light-emitting element 6BP'. In the present embodiment, a case will be described as an example in which all of the PWM drive light-emitting elements 6WP', 6WP1', 6WP2', 6WP3', 6RP', 6GP', and 6BP' included in each of the plurality of pixels are driven by the EMI signal having the same duty ratio, that is, driven in the same lighting period. In such a case, the PWM drive light-emitting elements 6WP', 6WP1', 6WP2', 6WP3', 6RP', 6GP', and 6BP' included in each of the plurality of pixels may be driven in the same lighting time corresponding to the grayscale value (CV) of the subpixel corresponding to the minimum luminance in the input video signal for one screen. Note that in a case where a grayscale value (CV) of a subpixel of each color is greater than the grayscale value (CV) of the subpixel corresponding to the minimum luminance in the input video signal for one screen, a current value corresponding to the difference grayscale value (difference CV) drives each of the current drive red light-emitting element 10RC', the current drive green light-emitting element 10GC', and the current drive blue light-emitting element 10BC' provided in each of the plurality of pixels of the display devices 20a, 20b, 20c, 20d, 20e, and 20f, and the obtained light emission luminance is added. The present embodiment is not limited thereto, and, for example, in a case where each of the plurality of pixels includes three PWM drive light-emitting elements 6RP', 6GP', and 6BP' as in the display devices 20e and 20f, the three PWM drive light-emitting elements 6RP', 6GP', and 6BP' included in each pixel may be driven by respective different EMI signals, that is, driven in different lighting periods. Note that in this case, each of the three PWM drive light-emitting elements 6RP', 6GP', and 6BP' provided in each pixel may be driven in a lighting time corresponding to the grayscale value (CV) of the subpixel corresponding to the minimum luminance obtained for each of the subpixels of respective colors in the input video signal for one screen. In this case as well, in a case where a grayscale value (CV) of a subpixel of each color is greater than the grayscale value (CV) of the subpixel corresponding to the minimum luminance in the input video signal for one screen, a current value corresponding to the difference grayscale value (difference CV)

drives each of the current drive red light-emitting element 10RC', the current drive green light-emitting element 10GC', and the current drive blue light-emitting element 10BC', and the obtained light emission luminance is added.

A case will be described as an example in which each of the plurality of pixels of the display device 20g, which is the monochrome display device, includes one PWM drive white light-emitting element 6WP1', and in the present embodiment, every PWM drive white light-emitting element 6WP1' included in each of the plurality of pixels is driven by the EMI signal having the same duty ratio, that is, driven in the same lighting period. In such a case, the PWM drive white light-emitting element 6WP1' included in each of the plurality of pixels may be driven in the same lighting time corresponding to a grayscale value (CV) of one pixel corresponding to the minimum luminance in the input video signal for one screen. Since the display device 20g is the monochrome display device, the grayscale value (CV) of the one pixel corresponding to the minimum luminance is obtained in the input video signal for one screen. In a case where a grayscale value (CV) of a corresponding one pixel is greater than the grayscale value (CV) of the pixel corresponding to the minimum luminance in the input video signal for one screen, a current value corresponding to the difference grayscale value (difference CV) drives the current drive white light-emitting element 10WC1', and the obtained light emission luminance is added.

In the present embodiment, a case will be described in which the display devices 20h, 20i, and 20j are used as the monochrome display devices. Each of the plurality of pixels of the display devices 20h, 20i, and 20j includes three PWM drive red light-emitting element 6RP', the PWM drive green light-emitting element 6GP', and the PWM drive blue light-emitting element 6BP'. In the present embodiment, a case will be described as an example in which all of the PWM drive red light-emitting element 6RP', the PWM drive green light-emitting element 6GP', and the PWM drive blue light-emitting element 6BP' included in each of the plurality of pixels are driven by the EMI signal having the same duty ratio, that is, driven in the same lighting period. In such a case, the PWM drive red light-emitting element 6RP', the PWM drive green light-emitting element 6GP', and the PWM drive blue light-emitting element 6BP' included in each of the plurality of pixels may be driven in the same lighting time corresponding to the grayscale value (CV) of one pixel corresponding to the minimum luminance in the input video signal for one screen. In a case where a grayscale value (CV) of a corresponding one pixel is greater than the grayscale value (CV) of the pixel corresponding to the minimum luminance in the input video signal for one screen, a current value corresponding to the difference grayscale value (difference CV) drives the current drive white light-emitting elements 10WC' and 10WC1', and the obtained light emission luminance is added.

Each of the plurality of pixels of the display device 20k includes the PWM drive green light-emitting element 6GP', the current drive red light-emitting element 10RC', and the current drive blue light-emitting element 10BC'. As will be described in detail in a fifth embodiment, each of the PWM drive green light-emitting element 6GP', the current drive red light-emitting element 10RC', and the current drive blue light-emitting element 10BC', which are provided in each pixel, is individually driven based on the grayscale value (CV) of each color subpixel of the input video signal for one screen.

Each of the plurality of pixels of the display device 20l includes the PWM drive blue light-emitting element 6BP', the current drive red light-emitting element 10RC', and the current drive green light-emitting element 10GC'. As will be described in detail in the fifth embodiment, each of the PWM drive blue light-emitting element 6BP', the current drive red light-emitting element 10RC', and the current drive green light-emitting element 10GC', which are provided in each pixel, is individually driven based on the grayscale value (CV) of each color subpixel of the input video signal for one screen.

Each of the plurality of pixels of the display device 20m includes the PWM drive blue light-emitting element 6BP', the current drive red light-emitting element 10RC', the current drive green light-emitting element 10GC', and the current drive blue light-emitting element 10BC'. Every PWM drive blue light-emitting element 6BP' included in each of the plurality of pixels is driven by the EMI signal having the same duty ratio, that is, driven in the same lighting period. In such a case, the PWM drive blue light-emitting element 6BP' included in each of the plurality of pixels may be driven in the same lighting time corresponding to a grayscale value (CV) of the blue subpixel corresponding to the minimum luminance in the input video signal for one screen. In a case where a grayscale value (CV) of a corresponding blue subpixel is greater than the grayscale value (CV) of the blue subpixel corresponding to the minimum luminance in the input video signal for one screen a current value corresponding to the difference grayscale value (difference CV) drives the current drive blue light-emitting element 10BC', and the obtained light emission luminance is added. Note that the current drive red light-emitting element 10RC' provided in each pixel is driven based on a grayscale value (CV) of a corresponding red subpixel of the input video signal for one screen, and the current drive green light-emitting element 10GC' provided in each pixel is driven based on a grayscale value (CV) of a corresponding green subpixel of the input video signal for one screen.

Each of the plurality of pixels of the display device 20n includes the PWM drive blue light-emitting element 6BP', the PWM drive green light-emitting element 6GP', and the current drive red light-emitting element 10RC'. As will be described in detail in the fifth embodiment, each of the PWM drive blue light-emitting element 6BP', the PWM drive green light-emitting element 6GP', and the current drive red light-emitting element 10RC', which are provided in each pixel, is individually driven based on the grayscale value (CV) of each color subpixel of the input video signal for one screen.

As described above, each of the display devices 20a to 20j that are the modified examples of the present embodiment includes the pixel PIX including the PWM drive light-emitting elements 6WP', 6WP1', 6WP2', 6WP3', 6RP', 6GP', and/or 6BP' in which the light emission luminance during the predetermined period is controlled by controlling the lighting period among the predetermined period, and the current drive light-emitting elements 10RC', 10GC', 10BC', 10WC1', and/or 10WC' in which the light emission luminance is controlled by controlling the current value. Thus, in the display devices 20a to 20j, the minimum luminance of the pixel PIX can be secured by causing the PWM drive light-emitting elements 6WP', 6WP1', 6WP2', 6WP3', 6RP', 6GP', and/or 6BP' to emit light by the PWM-driving method having high luminous efficiency, and the luminance of a portion exceeding the minimum luminance can be secured using the current drive light-emitting elements 10RC', 10GC', 10BC', 10WC1', and/or 10WC' in which the light emission luminance is controlled by controlling the current value. Thus, the display devices 20a to 20j with improved grayscale reproducibility in each pixel can be achieved. With proactive use of the light emission of the PWM drive light-emitting element, a current density applied to the current drive light-emitting element can be reduced, leading to suppression of degradation of the current drive light-emitting element. Furthermore, it is possible to increase a moving picture blur reduction effect by driving the PWM drive light-emitting element.

In general, green requires a high luminance output as compared with red and blue. In a case of the display device 20k, the green light emission can be secured by causing the PWM drive green light-emitting element 6GP' to emit light by the PWM-driving method having high luminous efficiency, and thus the display device 20k having high luminous efficiency and being capable of suppressing the power consumption can be achieved. Since the current drive light-emitting elements and the PWM drive light-emitting elements can be combined to emit light, the display device 20k with improved grayscale reproducibility in each pixel can be achieved.

Light emission of blue has lower luminous efficiency as compared with light emission of red and green, and a high current is required to be supplied in order to obtain the luminance of blue. In a case of the display device 20l, the luminance of blue can be secured by making the light-emitting area of blue larger than the light-emitting areas of other colors, and by causing the PWM drive blue light-emitting element 6BP' to emit light by the PWM-driving method having high luminous efficiency, and thus the display device 20l having high luminous efficiency and being capable of suppressing the power consumption can be achieved. Since the current drive light-emitting elements and the PWM drive light-emitting elements can be combined to emit light, the display device 20l with improved grayscale reproducibility in each pixel can be achieved.

Light emission of blue has lower luminous efficiency as compared with light emission of red and green, and a high current is required to be supplied in order to obtain the luminance of blue. In a case of the display device 20m, a portion of the luminance of blue can be secured by making the light-emitting area of blue larger than the light-emitting areas of other colors, and by causing the PWM drive blue light-emitting element 6BP' to emit light with the PWM-driving method having high luminous efficiency, and thus the display device 20m having high luminous efficiency and being capable of suppressing the power consumption can be achieved. Since the current drive light-emitting elements and the PWM drive light-emitting elements can be combined to emit light, the display device 20m with improved grayscale reproducibility in each pixel can be achieved.

In general, green requires a high luminance output as compared with red and blue. Light emission of blue has lower luminous efficiency as compared with light emission of red and green, and a high current is required to be supplied in order to obtain the luminance of blue. In the case of the display device 20n, the green light emission that requires high luminance output can be secured by emitting the PWM drive green light-emitting element 6GP' by the PWM-driving method having high luminous efficiency. The luminance of blue can be secured by making the light-emitting area of blue larger than the light-emitting areas of other colors, and by causing the PWM drive blue light-emitting element 6BP' to emit light by the PWM-driving method having high luminous efficiency, and thus the display device 20n having high luminous efficiency and being capable of suppressing the power consumption can be achieved. Since the current drive light-emitting elements and the PWM drive light-emitting elements can be combined to emit light, the display device 20n with improved grayscale reproducibility in each pixel can be achieved.

Third Embodiment

Next, a third embodiment of the disclosure will be described with reference to FIG. 10 and FIG. 11. The present embodiment is different from the first embodiment in that the input video signal processor of the display device according to the present embodiment is provided with a line video analysis unit 17a and a PWM control lighting time determination unit 18a of each line, and the other details are as described in the first embodiment. For convenience of explanation, components having the same functions as those illustrated in diagrams of the first embodiment are appended with the same reference signs, and descriptions thereof may be omitted.

FIG. 10 is a diagram illustrating a schematic configuration of the input video signal processor provided in the display device according to the third embodiment.

Figure 11:
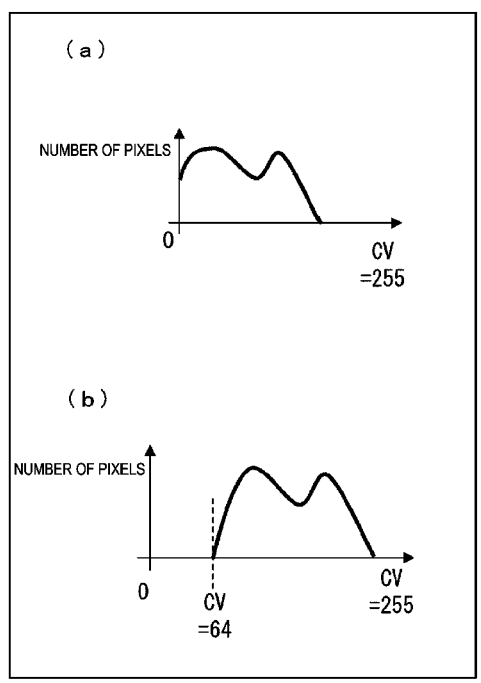

(a) of FIG. 11 and (b) of FIG. 11 are diagrams for describing signal processing performed in the input video signal processor provided in the display device according to the third embodiment.

The line video analysis unit 17a illustrated in FIG. 10 performs analysis in units of the input video signals supplied to pixels for one line (a plurality of pixels electrically connected to one lighting period control line) in the display region of the display device. For example, a histogram as shown in (b) of FIG. 11 can be obtained that shows an analysis result of the input video signal for one line. The histogram shown in (b) of FIG. 11 is data indicating the number of corresponding pixels (number of corresponding subpixels) for each grayscale value (CV) corresponding to luminance in each of the red subpixel RSP, the green subpixel GSP, and the blue subpixel BSP, included in each pixel of one line. The histogram shown in (a) of FIG. 11 is an example of data indicating the number of corresponding pixels (number of corresponding subpixels) for each grayscale value (CV) corresponding to luminance in each of the red subpixel RSP, the green subpixel GSP, and the blue subpixel BSP, included in each pixel for one screen. Since pixels (number of subpixels) with a grayscale value (CV) corresponding to luminance being zero are included in many cases, there is a problem in that the PWM drive light-emitting element cannot be driven by the PWM-driving method having high luminous efficiency in many cases. In the histogram shown in (b) of FIG. 11 obtained for each line, the probability that the grayscale value (CV) corresponding to luminance is zero is lower than that in the histogram shown in (a) of FIG. 11 obtained for each screen.

In the case of the histogram shown in (b) of FIG. 11, the grayscale value (CV) of the subpixel corresponding to the minimum luminance in the input video signal for one line is 64. That is, in the input video signal for one line, the grayscale value (CV) of each subpixel is 64 or more.

The line video analysis unit 17a illustrated in FIG. 10 transmits, to the PWM control lighting time determination unit 18a of each line illustrated in FIG. 10, the result of the video analysis that the grayscale value (CV) of the subpixel corresponding to the minimum luminance in the input video signal for one line is 64. The PWM control lighting time determination unit 18a of each line determines a lighting time when the minimum grayscale value (minimum CV) is 64, by using the transmitted result of the video analysis.

The current control output current calculation unit 19 illustrated in FIG. 10 subtracts 64, which is the minimum grayscale value (minimum CV) of the subpixel corresponding to the minimum luminance in the input video signal for one line, from the grayscale value (CV) in each of the red subpixel RSP, the green subpixel GSP, and the blue subpixel BSP included in the input video signal for one line, and calculates a difference grayscale value (difference CV) in each of the red subpixel RSP, the green subpixel GSP, and the blue subpixel BSP included in the input video signal for one line. The current control output current calculation unit 19 calculates a difference grayscale value (difference CV) for one screen for each line.

Each of the plurality of pixels of the display devices 1 and 1a to 1f illustrated in FIG. 1 and FIG. 6, and the display devices 20 and 20a to 20j illustrated in FIG. 7, FIG. 8, and FIG. 9 includes one or more of the PWM drive light-emitting elements, and thus all of the PWM drive light-emitting elements included in each of the plurality of pixels of the same one line can be driven by the EMI signal having the same duty ratio, that is, driven in the same lighting period. In such a case, the PWM drive light-emitting elements included in each of the plurality of pixels of the same one line may be driven in the same lighting time corresponding to the grayscale value (CV) of the subpixel corresponding to the minimum luminance in the corresponding input video signal for one line.

The present embodiment is not limited thereto, and, for example, in a case where each of the plurality of pixels includes three PWM drive light-emitting elements 6RP, 6GP, and 6BP, or 6RP', 6GP', and 6BP' and three current drive light-emitting elements 10RC, 10GC, and 10BC, or 10RC', 10GC', and 10BC' as in the display devices 1, 1c, 20, 20e, and 20f, each of the three PWM drive light-emitting elements 6RP, 6GP, and 6BP, or 6RP', 6GP', and 6BP' included in each pixel may be driven in a lighting time corresponding to the minimum grayscale value (minimum CV) of the subpixel corresponding to the minimum luminance for each of the subpixels of respective colors in the input video signal for one line, that is, driven in a different lighting period.

In the first and second embodiments described above, the PWM drive light-emitting element provided in each pixel is driven in the lighting time corresponding to the minimum grayscale value (minimum CV) of the subpixel corresponding to the minimum luminance in the input video signal for one screen, and thus, the PWM drive light-emitting element cannot be driven in a case where an input video signal in which only a part is a black display is input.

In the present embodiment, the PWM drive light-emitting element provided in each pixel is driven in the lighting time corresponding to the minimum grayscale value (minimum CV) of the subpixel corresponding to the minimum luminance in the input video signal for one line, and thus the PWM drive light-emitting element can be driven unless the black display is included in the input video signal for one line. Thus, the PWM drive light-emitting element can be further efficiently controlled.

As described above, also in a case where analysis is performed in units of the input video signals supplied to pixels for one line in the display region of the display device, and the PWM drive light-emitting elements and the current drive light-emitting elements are driven, the display device with improved grayscale reproducibility in each pixel can be achieved. With proactive use of the light emission of the PWM drive light-emitting element, a current density applied to the current drive light-emitting element can be reduced, leading to suppression of degradation of the current drive light-emitting element. Furthermore, it is possible to increase a moving picture blur reduction effect by driving the PWM drive light-emitting element.

Note that in the present embodiment, the line video analysis unit 17a outputs, as the result of the video analysis, the grayscale value (CV) of the subpixel corresponding to the minimum luminance in the input video signal for one line, however, the present embodiment is not limited thereto. For example, the line video analysis unit 17a may output, as the result of the video analysis, a grayscale value higher than the grayscale value of the subpixel corresponding to the minimum luminance in the input video signal for one line. More specifically, for example, the line video analysis unit 17a may output, as the result of the video analysis, the grayscale value (CV) of an n-th (n is a natural number) pixel from dark side in the input video signal for one line. With this configuration, a ratio of the light emission by the PWM control can be further increased.

In the present embodiment, the line video analysis unit 17a outputs, as the result of the video analysis, the grayscale value (CV) of the subpixel corresponding to the minimum luminance in the input video signal for one line, however, a plurality of lines may be analyzed together.

Fourth Embodiment

Next, a fourth embodiment of the disclosure will be described with reference to FIG. 12 and FIG. 13. The present embodiment is different from the first and the third embodiments in that the input video signal processor of the display device according to the present embodiment is provided with a multiple line video analysis unit 17b and a PWM control lighting time determination unit 18b after adjustment between lines, and the other details are as described in the first and the third embodiments. For convenience of explanation, components having the same functions as those illustrated in diagrams of the first and the third embodiments are appended with the same reference signs, and descriptions thereof may be omitted.

Figure 12:
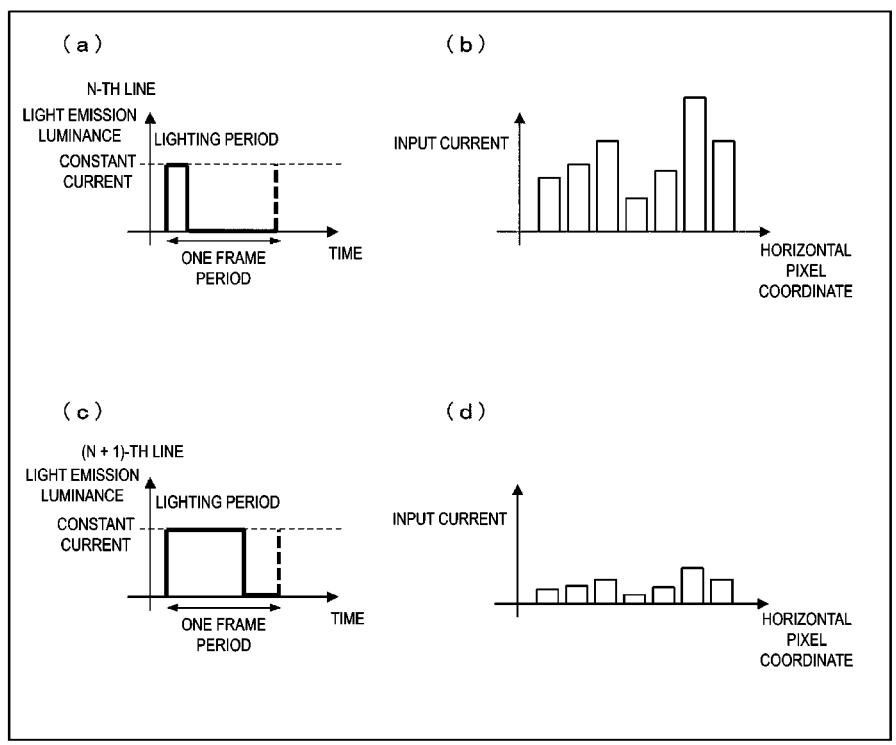

(a) of FIG. 12, (b) of FIG. 12, (c) of FIG. 12, and (d) of FIG. 12 are diagrams for describing signal processing performed in the input video signal processor provided in the above-described display device according to the third embodiment.

Although there is no large difference in an input grayscale value (CV) of the input video signal between an n-th line and an (n+1)-th line adjacent to each other (between the plurality of pixels electrically connected to the n-th lighting period control line and the plurality of pixels electrically connected to the (n+1)-th lighting period control line), the PWM drive light-emitting element is driven in a lighting time corresponding to the minimum grayscale value (minimum CV) of the subpixel corresponding to the minimum luminance in the input video signal for one line, and thus the lighting period of the PWM drive light-emitting element may be significantly different between lines adjacent to each other (the n-th line and the (n+1)-th line) as shown in (a) of FIG. 12 and (c) of FIG. 12. For example, in a case where in the PWM drive light-emitting element of the n-th line, the lighting period is 20% of the one frame period, and in the PWM drive light-emitting element of the (n+1)-th line, the lighting period is 80% of the one frame period, the current drive light-emitting element of the n-th line requires current input for the remaining 80%, but current input amount 20% is sufficient for the current drive light-emitting element of the (n+1)-th line, as shown in (b) of FIG. 12 and (d) of FIG. 12.

In such a case, the current drive light-emitting element of the n-th line is accelerated in degradation by the input current amount being increased, and luminance difference may occur as burn-in.

Thus, it is desirable to adjust the lighting period of the PWM drive light-emitting elements and the current input amount to the current drive light-emitting elements so that a large difference does not occur between the n-th line and the (n+1)-th line adjacent to each other.

FIG. 13 is a diagram illustrating a schematic configuration of the input video signal processor provided in the display device according to the fourth embodiment.

The multiple line video analysis unit 17b illustrated in FIG. 13 performs analysis in units of the input video signals supplied to pixels of the multiple lines in the display region of the display device. The multiple line video analysis unit 17b illustrated in FIG. 13 transmits the result of the video analysis to the PWM control lighting time determination unit 18b after adjustment between lines illustrated in FIG. 13. The PWM control lighting time determination unit 18b after adjustment between lines may set, by using the transmitted result of the video analysis, an upper limit value of a change in the lighting period of the PWM drive light-emitting elements between the n-th line and the (n+1)-th line adjacent to each other so that there is no large difference in the lighting period of the PWM drive light-emitting elements and the current input amount to the current drive light-emitting elements between the n-th line and the (n+1)-th line adjacent to each other, and the lighting period of the PWM drive light-emitting element may be determined within this range. For example, an upper limit value of a change in the lighting period of the PWM drive light-emitting elements between pixels in the n-th line and the (n+1)-th line adjacent to each other, or a change in the lighting period of the PWM drive light-emitting element between subpixels having the same color in the n-th line and the (n+1)-th line adjacent to each other may be set, and the lighting period of the PWM drive light-emitting elements may be determined within this range. The present embodiment is not limited thereto, and, the PWM control lighting time determination unit 18b after adjustment between lines may determine the lighting time of the grayscale value (CV) of the subpixel corresponding to the minimum luminance in the input video signal for the plurality of lines.

Furthermore, the PWM control lighting time determination unit 18b after adjustment between lines may once calculate the lighting period of the PWM drive light-emitting element of each line, and then determine the lighting period of the PWM drive light-emitting elements of the lines adjacent to each other by using a value obtained by applying a low pass filter to each of calculated values to be blunted.

As described above, also in the case where, after adjusting the lighting period of the PWM drive light-emitting elements and the current input amount to the current drive light-emitting elements so that the large difference does not occur between the plurality of lines adjacent to each other, the PWM drive light-emitting elements and the current drive light-emitting elements are driven, the display device with improved grayscale reproducibility in each pixel can be achieved. Furthermore, reducing the change in the lighting period of the PWM drive light-emitting elements between the plurality of lines adjacent to each other allows a difference in current densities of the current drive light-emitting elements between the plurality of lines adjacent to each other to be reduced, and burn-in (luminance difference) due to degradation can also be made inconspicuous.

Fifth Embodiment

Next, a fifth embodiment of the disclosure will be described below with reference to FIG. 14 and FIG. 15. The present embodiment is different from the first, third and fourth embodiments in that the input video signal processor of the display device according to the present embodiment generates an EMI signal for individually driving the PWM drive light-emitting element provided in each pixel in units of pixels or in units of subpixels, and the other details are as described in the first, third, and fourth embodiments. For convenience of explanation, components having the same functions as those illustrated in diagrams of the first, third, and fourth embodiments are appended with the same reference signs, and descriptions thereof may be omitted.

The input video signal processor of the display device according to the fifth embodiment generates an EMI signal for individually driving each PWM drive light-emitting element provided in each pixel in units of pixels or in units of subpixels. Thus, the PWM drive light-emitting element can be individually driven in units of pixels or in units of subpixels, and thus the degree of freedom of driving the PWM drive light-emitting element is increased.

In a case where each of the plurality of pixels includes three PWM drive light-emitting elements 6RP, 6GP, 6BP, 6RP', 6GP', and 6BP' of respective colors and three current drive light-emitting elements 10RC, 10GC, 10BC, 10RC', 10GC', and 10BC' of respective colors as in the display devices 1, 1c, 20, 20e, and 20f illustrated in FIG. 1, FIG. 6, FIG. 7, and FIG. 8, each of the three PWM drive light-emitting elements 6RP, 6GP, 6BP, 6RP', 6GP', and 6BP' of respective colors included in each pixel may be driven in the same lighting period corresponding to the minimum grayscale value (minimum CV) of the subpixel corresponding to the minimum luminance of the subpixel in the input video signal for each pixel. That is, the input video signal processor can generate the EMI signal for individually driving each of the PWM drive light-emitting elements provided in each pixel in units of pixels, and can individually drive each of the PWM drive light-emitting elements provided in each pixel in units of pixels. Note that in a case where a grayscale value (CV) of a corresponding subpixel is greater than the grayscale value (CV) corresponding to the minimum luminance in the input video signal for each pixel, a current value corresponding to the difference grayscale value (difference CV) drives the three current drive light-emitting elements 10RC, 10GC, 10BC, 10RC', 10GC', and 10BC' of respective colors, and the obtained light emission luminance is added.

In a case where each of the plurality of pixels includes one or more of the PWM drive white light-emitting elements 6WP, 6WP1, 6WP2, 6WP3, 6WP', 6WP1', 6WP2', and 6WP3', and three current drive light-emitting elements 10RC, 10GC, 10BC, 10RC', 10GC', and 10BC' of respective colors as in the display devices 1a, 1b, and 1d illustrated in FIG. 6, and the display devices 20a to 20d illustrated in FIG. 8, each of one or more of the PWM drive white light-emitting elements 6WP, 6WP1, 6WP2, 6WP3, 6WP', 6WP1', 6WP2', and 6WP3' included in each pixel may be driven in the same lighting period corresponding to the minimum grayscale value (minimum CV) of the subpixel corresponding to the minimum luminance of the subpixel in the input video signal for each pixel. Note that in a case where the grayscale value (CV) of the corresponding subpixel is greater than the grayscale value (CV) corresponding to the minimum luminance in the input video signal for each pixel, a current value corresponding to the difference grayscale value (difference CV) drives the three current drive light-emitting elements 10RC, 10GC, 10BC, 10RC', 10GC', and 10BC' of respective colors, and the obtained light emission luminance is added. Thus, the display device with improved grayscale reproducibility in each pixel can be achieved.

FIG. 15 is a diagram for describing signal processing performed in the input video signal processor provided in the display device according to the fifth embodiment.

As shown in FIG. 15, the PWM drive light-emitting element may be controlled in eight stages (P1 to P8) according to the minimum grayscale value (minimum CV) of the subpixel corresponding to the minimum luminance of the subpixel in the input video signal for each pixel. In a case where the grayscale value (CV) of the corresponding subpixel is greater than the grayscale value (CV) corresponding to the minimum luminance in the input video signal for each pixel, a current value corresponding to the difference grayscale value (difference CV) drives the current drive light-emitting element, and the obtained light emission luminance is added. Thus, the display device with improved grayscale reproducibility in each pixel can be achieved.

As described above, when the control is performed in units of pixels, the lighting period of the PWM drive light-emitting element and the current input amount to the current drive light-emitting element may differ greatly between the pixels. In this case, similarly to the case between the lines adjacent to each other described above in the fourth embodiment, the applied current density is different between the pixels, and thus degradation rate of the current drive light-emitting element may be affected, leading to occurrence of burn-in (luminance difference) or the like. Thus, it is desirable to adjust the lighting period of the PWM drive light-emitting elements and the current amount input to the current drive light-emitting elements in units of blocks including pixels adjacent to each other so that a large difference is not generated.

FIG. 14 is a diagram illustrating a schematic configuration of the input video signal processor provided in the display device according to the fifth embodiment.

The block video analysis unit 17c illustrated in FIG. 14 performs analysis in units of the input video signals supplied to pixels of a certain block including the pixels adjacent to each other in the display region of the display device. The block video analysis unit 17c illustrated in FIG. 14 transmits the result of the video analysis to a PWM control lighting time determination unit 18c after adjustment between pixels illustrated in FIG. 14. The PWM control lighting time determination unit 18c after adjustment between the pixels adjust the lighting period of the PWM drive light-emitting elements and the current amount input to the current drive light-emitting elements in units of blocks including pixels adjacent to each other so that a large difference does not occur to determine the lighting period of the PWM drive light-emitting elements.

In determining the lighting period of the PWM drive light-emitting element and the current input amount to the current drive light-emitting element in units of pixels, the block video analysis unit 17c may, for example, perform video analysis of a predetermined pixel region (for example, 10×10 pixels) including one pixel of interest, or may perform video analysis of a region (11×11 pixels) of peripheral five pixels of the one pixel of interest. In such a case, the lighting period of the PWM drive light-emitting element of the one pixel of interest may be determined in accordance with a minimum grayscale value (CV) in data of the predetermined pixel region or the peripheral pixel region. Once the lighting period of the PWM drive light-emitting elements may be calculated for each pixel of the predetermined pixel region or for each pixel of the peripheral pixel region, and a value obtained by applying a low pass filter to the result to be blunted is used, and then the lighting period of the PWM drive light-emitting elements of the one pixel of interest may be determined. Furthermore, an upper limit value may be set so that the lighting period does not change to a predetermined value or more between the one pixel of interest and the peripheral pixels, and the lighting period may be determined within this range.

In the above, it is desirable to adjust the lighting period of the PWM drive light-emitting elements and the current input amount to the current drive light-emitting elements in accordance with the peripheral pixels, but, for example, in a case where an HDR video is taken into consideration, the embodiment is not limited to this method. In a case where the pixel can be determined to be a pixel to display peak luminance, the adjustment need not be performed in accordance with peripheral pixels thereof.

In the above-described first to fourth embodiments and the present embodiment, a case will be described in which the lighting period of the PWM drive light-emitting element is determined in advance, but the present embodiment is not limited thereto. Conversely, the current input amount to the current drive light-emitting element may be determined so as to be constant in one screen in advance, and the lighting period of the PWM drive light-emitting element may be determined so as to obtain a desired luminance.

In a case where each of the plurality of pixels includes one current drive white light-emitting element 10WC, 10WC', or 10WC1', and three PWM drive light-emitting elements 6RP, 6GP, 6BP, 6RP', 6GP', and 6BP' of each color as in the display device 1f illustrated in FIG. 6 and the display devices 20h to 20j illustrated in FIG. 9, each of them can be individually driven. Although the current drive white light-emitting elements 10WC, 10WC', and 10WC1' are not efficient on high luminance side, in the case of representing a gray low grayscale region, representation maintaining white balance can be efficiently performed by controlling only the current drive white light-emitting elements 10WC, 10WC', and 10WC1'. In a case where there is a grayscale with the white balance lost by controlling only the current drive white light-emitting elements 10WC, 10WC', and 10WC1', adjustment can be performed by combining the three PWM drive light-emitting elements 6RP, 6GP, 6BP, 6RP', 6GP', and 6BP' of respective colors. In such a case, all grayscale representation of each pixel is achieved by combining the current drive white light-emitting elements and the PWM drive light-emitting elements, and thus the display device with improved grayscale reproducibility in each pixel can be achieved.

In a case where each of the plurality of pixels includes one or more of current drive light-emitting elements 10RC', 10GC', and 10BC' of respective colors, and one or more of PWM drive light-emitting elements 6GP' and 6BP' of respective colors as in the display devices 20k to 20n illustrated in FIG. 9, each of them can be individually driven. That is, the light-emitting elements can be driven in units of subpixels. In such a case, all grayscale representation of each pixel is achieved by combining the current drive light-emitting elements and the PWM drive light-emitting elements, and thus the display device with improved grayscale reproducibility in each pixel can be achieved.

As described above, driving the light-emitting elements in units of pixels or in units of subpixels allows improvement of the grayscale reproducibility and moving picture blur reduction to be achieved.

Sixth Embodiment

Next, with reference to FIG. 16 and FIG. 17, a sixth embodiment of the disclosure will be described. The display device according to the present embodiment is different from that of the first to fifth embodiments in that a light-emitting element having more efficient element characteristic than the current drive light-emitting element is used as the PWM drive light-emitting element included in each pixel, and the other details are as described in the first to fifth embodiments. For convenience of explanation, components having the same functions as those illustrated in diagrams of the first to fifth embodiments are appended with the same reference signs, and descriptions thereof may be omitted.

Figure 16:
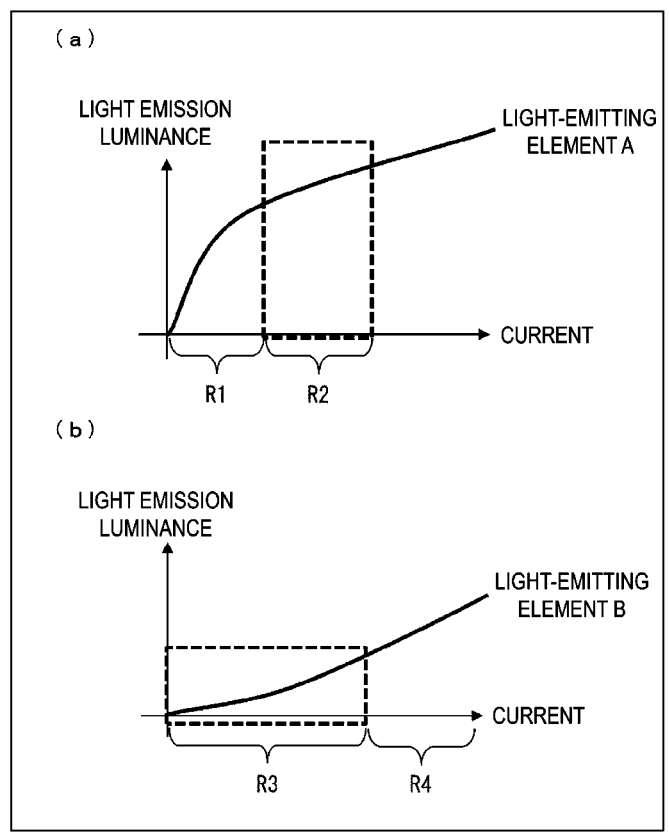

(a) of FIG. 16 is a diagram showing element characteristic of a PWM drive light-emitting element included in each pixel of the display device according to the sixth embodiment, and (b) of FIG. 16 is a diagram showing element characteristic of a current drive light-emitting element included in each pixel of the display device according to the sixth embodiment.

As shown in (a) of FIG. 16, the PWM drive light-emitting element includes a first light-emission characteristic region R1 in which a change amount in light emission luminance with respect to a change in a current value is a certain value or more, and a second light-emission characteristic region R2 in which the change amount in light emission luminance with respect to the change in the current value is less than the certain value. A current value in the first light-emission characteristic region R1 is smaller than a current value in the second light-emission characteristic region R2, and in the present embodiment, the PWM drive light-emitting element is driven by the current value included in the second light-emission characteristic region R2 during the lighting period.

The element characteristic of the PWM drive light-emitting element shown in (a) of FIG. 16 has highly efficient element characteristic and can obtain high luminance at a low current, but the steep rising is not suitable for the grayscale reproducibility. Thus, in the present embodiment, such a light-emitting element is PWM-driven using a current value included in the second light-emission characteristic region R2, which is a region with the stable rising. In the luminance output by the lighting period control of the PWM drive, it is desirable that the relationship between the current and the luminance is linear. The luminance output may be determined mainly by controlling the lighting period, or the current value can also be changed according to the input signal. Also in the case of changing the current value, since the relationship between the current and the luminance is linear, the control is easy.

As shown in (b) of FIG. 16, the current drive light-emitting element includes a third light-emission characteristic region R3 in which the change amount in light emission luminance with respect to the change in the current value is less than a certain value, and a fourth light-emission characteristic region R4 in which the change amount in light emission luminance with respect to the change in the current value is the certain value or more. A current value in the third light-emission characteristic region R3 is smaller than a current value in the fourth light-emission characteristic region R4, and in the present embodiment, the current drive light-emitting element is driven by the current value included in the third light-emission characteristic region R3.

The element characteristic of the current drive light-emitting element shown in (b) of FIG. 16 has low luminous efficiency since a high current is required for high luminance output but has smooth rising, which is particularly advantageous for the grayscale reproducibility in a dark part. Driving the current drive light-emitting element with the current value included in the third light-emission characteristic region R3 allows the reproducibility of the grayscale to be obtained while suppressing driving at the high current.

FIG. 17 is a diagram for describing driving methods of the PWM drive light-emitting element and the current drive light-emitting element included in each pixel of the display device according to the sixth embodiment.

As shown in FIG. 17, the PWM drive light-emitting element (light-emitting element A) is driven by the current value included in the second light-emission characteristic region R2, the current drive light-emitting element (light-emitting element B) is driven by the current value included in the third light-emission characteristic region R3, and the luminous efficiency in the second light-emission characteristic region R2 is greater than the luminous efficiency in the third light-emission characteristic region R3.

As described above, the PWM drive light-emitting element and the current drive light-emitting element have different characteristics. Such a PWM drive light-emitting element and a current drive light-emitting element may be prepared using, for example, light-emitting elements or materials having respective light-emission characteristics different from each other.

As described above, in the case where the video signal including high luminance is input by combining the PWM drive light-emitting element and the current drive light-emitting element to be driven, an increase in the lighting period of the PWM drive light-emitting element allows the grayscale reproduction in the current drive of the current drive light-emitting element to be achieved also on a high luminance side while saving power, and a higher quality display to be achieved. In a case where the video signal including low luminance is input, the lighting period of the PWM drive light-emitting element can be shortened, and the current drive light-emitting element can be controlled with emphasis on the dark part grayscale by current drive.

As described above, combining the PWM drive light-emitting element and the current drive light-emitting element to be driven allows improvement of the grayscale reproducibility to be achieved. PWM-driving the PWM drive light-emitting element allows moving picture blur reduction to be achieved. PWM-driving the PWM drive light-emitting element at a constant current value allows a burn-in (luminance different between pixels) due to degradation of the PWM drive light-emitting element to be suppressed. Furthermore, adding the PWM drive light-emitting element allows a current load on the current drive light-emitting element, the drive TFT for driving the current drive light-emitting element, and the like to be reduced, and thus the degradation of the current drive light-emitting element and the drive TFT can be suppressed.

Seventh Embodiment

Next, with reference to FIG. 18, a seventh embodiment of the disclosure will be described. A display device 30 according to the present embodiment is different from that of the first to sixth embodiments in that the combination driving of the PWM drive light-emitting element and the current drive light-emitting element is optimized in accordance with a display form of the image displayed on the display device 30, a type of an application, or a type of a display function, and the other details are as described in the first to sixth embodiments. For convenience of explanation, components having the same functions as those illustrated in diagrams of the first to sixth embodiments are appended with the same reference signs, and descriptions thereof may be omitted.

Figure 18:
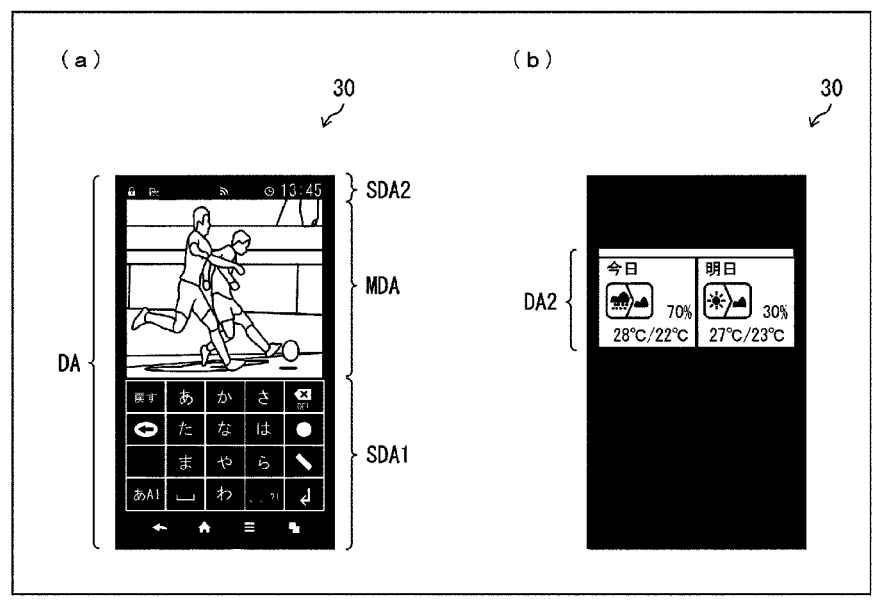

(a) of FIG. 18 and (b) of FIG. 18 are views illustrating a display region provided in the display device 30 according to the seventh embodiment.

The display device 30 is, for example, a smartphone or a tablet PC, and the grayscale reproducibility and the high luminance are required for the display of a normal video such as a photo and a moving image, but the grayscale reproducibility is not important for text data at the time of mail or browser display. Thus, in a case where the text data is mainly displayed, there is no problem even if the PWM drive light-emitting element is turned on only by PWM drive. In a case where the entire screen is text data, the PWM drive light-emitting elements of all pixels may be turned on only by PWM drive. As illustrated in (a) of FIG. 18, in a case where text data is displayed in a part of a display region DA of the display device 30, for example, in a lower half region SDA1 and an upper end region SDA2 of the display region DA, and a moving image is displayed in an upper half region MDA of the display region DA, only the PWM drive light-emitting element provided in each pixel may be turned on by PWM drive in the lower half region SDA1 and the upper end region SDA2 of the display region DA. That is, the display device 30 has a mode for displaying an image using only the PWM drive light-emitting element in at least a part of the display region DA including a plurality of pixels.

Such a display device 30 uses a light-emitting element having highly efficient element characteristic as the PWM drive light-emitting element, and thus a current applied to the PWM drive light-emitting element can be reduced and a drive unit (drive TFT) of the current drive light-emitting element can be deactivated, allowing a significant power saving to be achieved. This power saving is very important for mobile terminals. As illustrated in (b) of FIG. 18, in a terminal using a self-light-emitting display such as the OLED and the QLED, a function (Always ON, and the like) is installed in which a display is always continuously performed in a partial region DA2 of the display region DA. For example, the function may always continue to display the time in the partial region DA2 of the display region DA, and is used in the self-light-emitting display since the power consumption is small if the display is performed only in a part. Even in the case of achieving such a function, in the partial region DA2 of the display region DA, only the PWM drive light-emitting element provided in each pixel is turned on by PWM drive, and thus more power saving and high luminance output is possible.

As described above, optimizing the combination driving of the PWM drive light-emitting element and the current drive light-emitting element in accordance with the display form of the image displayed on the display device 30, the type of the application, or the type of the display function allows power saving while also securing sufficient luminance of the text display region without impairing the display quality of the normal video display region, in particular in the mobile terminal.

Eighth Embodiment

Next, with reference to FIG. 19 and FIG. 20, an eighth embodiment of the disclosure will be described. A display device 40 according to the present embodiment is different from that of the first to seventh embodiments in that the input video signal processor of the display device 40 includes a video analysis unit 17d including a motion detector, and the other details are as described in the first to seventh embodiments. For convenience of explanation, components having the same functions as those illustrated in diagrams of the first to seventh embodiments are appended with the same reference signs, and descriptions thereof may be omitted.

FIG. 19 is a view illustrating a schematic configuration of the input video signal processor provided in the display device 40 according to the eighth embodiment.

As illustrated in FIG. 19, the input video signal processor provided in the display device 40 includes the video analysis unit 17d including the motion detector. The video analysis unit 17d including the motion detector includes a motion detector that detects an object having a motion of a predetermined value or more in the input video signal. In a case where the motion detector detects the object having the motion of the predetermined value or more, the light emission luminance of the PWM-driven PWM drive light-emitting element may be increased, while the light emission luminance of the current-driven current drive light-emitting element may be reduced, at least in a region of the detected object, as compared with a case where the motion detector does not detect the object having the motion of the predetermined value or more. The present embodiment is not limited thereto, and in a case where the motion detector detects the object having the motion of the predetermined value or more, the lighting period of the PWM-driven PWM drive light-emitting element may be reduced at least in the region of the detected object, as compared with the case where the motion detector does not detect the object having the motion of the predetermined value or more. Furthermore, in the case where the motion detector detects the object having the motion of the predetermined value or more, a current value for driving the PWM drive light-emitting element may be increased at least in the region of the detected object, as compared with the case where the motion detector does not detect the object having the motion of the predetermined value or more.

FIG. 20 is a view illustrating a display region provided in the display device 40 according to the eighth embodiment.

The display device 40 is, for example, a television or a monitor, and optimizes the combination driving of the PWM drive light-emitting element and the current drive light-emitting element in order to improve the display performance of the moving picture at the time of the moving picture display. Also in the self-light-emitting display, similarly to the liquid crystal display, moving picture blur due to hold is a problem. This occurs when the same image is continuously displayed for one frame period, and has been reduced by intermittent lighting (PWM-driving) even in the liquid crystal.

In the display device 40, in a case where there is a video having a motion in a part in the video, the light emission luminance of the PWM-driven PWM drive light-emitting element may be increased, while the light emission luminance of the current-driven current drive light-emitting element may be reduced. In a case of a video having a large motion, the grayscale reproducibility is not important, and thus the luminance output caused by the current-driven current drive light-emitting element may be low or need not be turned on at all. Alternatively, the lighting period of the PWM-driven PWM drive light-emitting element may be shortened, and further, the current value for driving the PWM drive light-emitting element may be increased.

In a right-side region PWMOR of the display region provided in the display device 40 illustrated in FIG. 20, the moving picture blur is reduced and the display performance of the moving picture is improved by shortening the lighting period of the PWM-driven PWM drive light-emitting element and suppressing the lighting of the current-driven current drive light-emitting element. On the other hand, a left-side region CPR of the display region provided in the display device 40 is a region where the lighting period of the PWM-driven PWM drive light-emitting element, and the lighting of the current-driven current drive light-emitting element are not adjusted.

Ninth Embodiment

Next, a ninth embodiment according to the disclosure will be described with reference to FIG. 21 and FIG. 22. A display device 50 according to the present embodiment is different from that of the eighth embodiment in that an input video signal processor of the display device 50 includes a video analysis unit 17*d* including a motion detector that detects a movement operation of an image displayed in the display region by a touch of a user UR on a touch panel TP, and the other details are as described in the eighth embodiment. For convenience of explanation, components having the same functions as those illustrated in diagrams of the eighth embodiment are appended with the same reference signs, and descriptions thereof may be omitted.

FIG. 21 is a view illustrating a display region provided in the display device 50 according to the ninth embodiment.

FIG. 22 is a diagram illustrating a schematic configuration of the input video signal processor provided in the display device 50 according to the ninth embodiment.

As illustrated in FIG. 21 and FIG. 22, the display device 50 includes the video analysis unit 17*d* including the motion detector that detects the movement operation of the image displayed in the display region DA by the touch of the user UR on the touch panel TP.

For example, in order to improve the display performance of the moving picture at the time of up, down, left, and right scroll SCRD display of a browser at the mobile terminal, the combination driving of the PWM drive light-emitting element and the current drive light-emitting element are optimized. For example, even at the time of the display of the browser at the smartphone, it is important that the video moves smoothly (is not jerky) when vertically scrolled at a high speed, and improvement of display performance of the moving image is still essential.

The input video signal processor of the display device 50 according to the present embodiment includes the video analysis unit 17*d* including the motion detector that detects the movement operation of the image displayed in the display region DA by the touch of the user UR on the touch panel TP. Accordingly, in a case where the video analysis unit 17*d* including the motion detector detects the movement operation of the image displayed in the display region DA by the touch of the user UR on the touch panel TP, similarly to the case where the motion detector detects the object having the motion of the predetermined value or more in the eighth embodiment described above, the display performance of the moving image at the time of up, down, left, and right scroll SCRD display can be improved.

APPENDIX

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The disclosure can be utilized for a display device.

The invention claimed is:

1. A display device comprising:
a plurality of pixels, each including:
L first light-emitting elements, light emission luminance during a predetermined period being controlled by controlling a lighting period among the predetermined period in the L first light-emitting elements; and
a second light-emitting element, light emission luminance being controlled by controlling a current value in the second light-emitting element,
wherein L is a natural number of two or more,
an M-th of the L first light-emitting elements included in each of the plurality of pixels is driven in a same lighting period s,
M is a natural number of L or less,
an N-th of the L first light-emitting elements included in each of the plurality of pixels is driven in a same lighting period t,
N is a natural number of L or less and different from M, and
the lighting period s and the lighting period t are different from each other.

2. A display device comprising:
a plurality of pixels, each including:
L first light-emitting elements, light emission luminance during a predetermined period being controlled by controlling a lighting period among the predetermined period in the L first light-emitting elements; and
a second light-emitting element, light emission luminance being controlled by controlling a current value in the second light-emitting element,
wherein L is a natural number of two or more,
in each of the plurality of pixels, a lighting period of an M-th of the L first light-emitting elements included in each of the plurality of pixels and a lighting period of an N-th of the L first light-emitting elements included in each of the plurality of pixels are different from each other,
M is a natural number of L or less,
N is a natural number of L or less and different from M,
a lighting period of the M-th of the L first light-emitting elements included in an F-th pixel among the plurality of pixels and a lighting period of the M-th of the L first light-emitting elements included in a G-th pixel among the plurality of pixels are different from each other,
F is a natural number of one or more, and
G is a natural number of one or more and different from F.

3. The display device according to claim 2, wherein a difference between the lighting period of the M-th of the L first light-emitting elements included in the F-th pixel and the lighting period of the M-th of the L first light-emitting elements included in a pixel, among the plurality of pixels, adjacent to the F-th pixel is a predetermined value or less.

4. A display device comprising:
a pixel including:

a first light-emitting element, light emission luminance during a predetermined period being controlled by controlling a lighting period among the predetermined period in the first light-emitting element; and a second light-emitting element, light emission luminance being controlled by controlling a current value in the second light-emitting element, wherein the second light-emitting element includes a third light-emission characteristic region, a change amount in light emission luminance with respect to a change in a current value being less than a certain value in the third light-emission characteristic region, and a fourth light-emission characteristic region, a change amount in light emission luminance with respect to a change in a current value being the certain value or more in the fourth light-emission characteristic region, the current value in the third light-emission characteristic region is smaller than the current value in the fourth light-emission characteristic region, and the second light-emitting element is driven by the current value included in the third light-emission characteristic region.

5. The display device according to claim 4, wherein at least a part of the second light-emitting element overlaps the first light-emitting element in a plan view.

6. The display device according to claim 5, further comprising:

a substrate, wherein the second light-emitting element is disposed farther from the substrate than the first light-emitting element.

7. The display device according to claim 4, wherein the first light-emitting element includes a first light-emission characteristic region, a change amount in light emission luminance with respect to a change in a current value being another certain value or more in the first light-emission characteristic region, and a second light-emission characteristic region, a change amount in light emission luminance with respect to a change in a current value being less than the certain value in the second light-emission characteristic region, the current value in the first light-emission characteristic region is smaller than the current value in the second light-emission characteristic region, and the first light-emitting element is driven by the current value included in the second light-emission characteristic region during the lighting period.

8. The display device according to claim 4, wherein the first light-emitting element includes a first light-emission characteristic region, a change amount in light emission luminance with respect to a change in a current value being another certain value or more in the first light-emission characteristic region, and a second light-emission characteristic region, a change amount in light emission luminance with respect to a change in a current value being less than the certain value in the second light-emission characteristic region, the current value in the first light-emission characteristic region is smaller than the current value in the second light-emission characteristic region, and luminous efficiency in the second light-emission characteristic region of the first light-emitting element is greater than luminous efficiency in the third light-emission characteristic region of the second light-emitting element.

9. The display device according to claim 4, further comprising:

a plurality of pixels, including the pixel, wherein each of the plurality of pixels includes K first light-emitting elements, including the first light-emitting element, K is a natural number of one or more, and the K first light-emitting elements included in each of the plurality of pixels are driven in a same lighting period.

10. The display device according to claim 4, further comprising:

a plurality of pixels, including the pixel, and V lighting period control lines, wherein V is a natural number of two or more, each of the V lighting period control lines is electrically connected to H pixels of the plurality of pixels, H is a natural number of two or more, each of the plurality of pixels includes L first light-emitting elements, including the first light-emitting element, L is a natural number of two or more, and in each of the V lighting period control lines, an M-th of the L first light-emitting elements included in each of the H pixels electrically connected to a respective one of the V lighting period control lines is driven in a same lighting period s, an N-th of the L first light-emitting elements included in each of the H pixels electrically connected to the respective one of the V lighting period control lines is driven in a same lighting period t, and the same lighting period s and the same lighting period t are different from each other, M is a natural number of L or less, and N is a natural number of L or less and different from M.

11. The display device according to claim 10, wherein a difference between a lighting period of a first plurality of M-th first light-emitting elements, including the M-th of the L first light-emitting elements, electrically connected to a W-th of the V lighting period control lines and a lighting period of a second plurality of M-th first light-emitting elements, including the M-th of the L first light-emitting elements, electrically connected to one of the V lighting period control lines adjacent to the W-th of the V lighting period control lines is a predetermined value or less, and W is a natural number of one or more and V or less.

12. The display device according to claim 4, further comprising:

a plurality of pixels, including the pixel, and V lighting period control lines, wherein V is a natural number of two or more, each of the V lighting period control lines is electrically connected to H pixels of the plurality of pixels, H is a natural number of two or more, each of the H pixels includes K first light-emitting elements, including the first light-emitting element, K is a natural number of one or more, and in each of the V lighting period control lines, the K first light-emitting elements included in each of the H pixels electrically connected to a respective one of the lighting period control lines are driven in a same lighting period.

13. The display device according to claim 12, wherein a difference between a lighting period of a first plurality of first light-emitting elements of the K first light-emitting elements electrically connected to a W-th of the V lighting period control lines and a lighting period of a second plurality of first light-emitting elements of the K first light-emitting elements electrically connected to one of the V lighting period control lines adjacent to the W-th of the V lighting period control lines is a predetermined value or less, and W is a natural number of one or more and V or less.

14. The display device according to claim 4, further comprising:
a plurality of pixels, including the pixel,
wherein each of the plurality of pixels includes J first light-emitting elements, including the first light-emitting element,
J is a natural number of two or more,
the J first light-emitting elements included in each of the plurality of pixels are driven in a same lighting period,
a lighting period of the J first light-emitting elements included in an F-th pixel among the plurality of pixels and a lighting period of the J first light-emitting elements included in a G-th pixel among the plurality of pixels are different from each other,
F is a natural number of one or more, and
G is a natural number of one or more and different from F.

15. The display device according to claim 14,
wherein a difference between the lighting period of the J first light-emitting elements included in the F-th pixel and the lighting period of the J first light-emitting elements included in a pixel, among the plurality of pixels, adjacent to the F-th pixel is a predetermined value or less.

16. The display device according to claim 4, further comprising:
a plurality of pixels, including the pixel, wherein each of the plurality of pixels includes one first light-emitting element,
a lighting period of the one first light-emitting element included in an F-th pixel among the plurality of pixels and a lighting period of the one first light-emitting element included in a G-th pixel among the plurality of pixels are different from each other,
F is a natural number of one or more, and
G is a natural number of one or more and different from F.

17. The display device according to claim 4, further comprising:
a mode configured to display an image using only the first light-emitting element in at least a part of a display region including the pixel.

18. The display device according to claim 4, further comprising:
a motion detector configured to detect an object having a motion of a predetermined value or more in a video signal,
wherein, in a case that the motion detector detects the object having the motion of the predetermined value or more, the light emission luminance of the first light-emitting element is increased, while the light emission luminance of the second light-emitting element is reduced at least in a region of the detected object, as compared with a case that the motion detector does not detect the object having the motion of the predetermined value or more.

19. The display device according to claim 4, further comprising:
a motion detector configured to detect an object having a motion of a predetermined value or more in a video signal,
wherein, in a case that the motion detector detects the object having the motion of the predetermined value or more, the lighting period of the first light-emitting element is shortened at least in a region of the detected object, as compared with a case that the motion detector does not detect the object having the motion of the predetermined value or more.

\* \* \* \* \*